(12) United States Patent
Duriez et al.

(10) Patent No.: US 11,848,385 B2
(45) Date of Patent: Dec. 19, 2023

(54) LOCALIZED PROTECTION LAYER FOR LASER ANNEALING PROCESS

(71) Applicant: Taiwan Semiconductor Manufacturing Co., Ltd., Hsinchu (TW)

(72) Inventors: Blandine Duriez, Hsinchu (TW); Marcus Johannes Henricus Van Dal, Hsinchu (TW); Martin Christopher Holland, Hsinchu (TW); Gerben Doornbos, Kessel-Lo (BE); Georgios Vellianitis, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/706,199

(22) Filed: Mar. 28, 2022

(65) Prior Publication Data
US 2022/0223744 A1 Jul. 14, 2022

Related U.S. Application Data

(62) Division of application No. 16/586,790, filed on Sep. 27, 2019, now Pat. No. 11,302,820.

(51) Int. Cl.
*H01L 29/786* (2006.01)
*H01L 29/06* (2006.01)
(Continued)

(52) U.S. Cl.
CPC ...... *H01L 29/78618* (2013.01); *H01L 21/268* (2013.01); *H01L 21/28568* (2013.01);
(Continued)

(58) Field of Classification Search
CPC ......... H01L 29/78618; H01L 29/42392; H01L 29/78696; H01L 29/66545; H01L 21/268; H01L 21/324; H01L 29/66795
See application file for complete search history.

(56) References Cited

U.S. PATENT DOCUMENTS 5,605,842 A 2/1997 Langley et al.
5,605,847 A 2/1997 Zhang
(Continued)

FOREIGN PATENT DOCUMENTS

CN 106531719 A 3/2017
JP H0258216 A 2/1990

OTHER PUBLICATIONS

Orlowski et al., "Si, SiGe, Ge, and III-IV Semiconductor Nanomembranes and Nanowires Enabled by SiGe Epitaxy", 2010 ECS Trans. 33, pp. 777-789, 2010 (Year: 2010).*

*Primary Examiner* — Selim U Ahmed
*Assistant Examiner* — Evan G Clinton
(74) *Attorney, Agent, or Firm* — SEED IP LAW GROUP LLP

(57) ABSTRACT

A method of forming a semiconductor device includes forming source/drain contact openings extending through at least one dielectric layer to expose source/drain contact regions of source/drain structures. The method further includes depositing a light blocking layer along sidewalls and bottom surfaces of the source/drain contact openings and a topmost surface of the at least one dielectric layer. The method further includes performing a laser annealing process to activate dopants in the source/drain contact region. The method further includes forming source/drain contact structures within source/drain contact openings.

20 Claims, 25 Drawing Sheets

(51) Int. Cl.
*H01L 29/423* (2006.01)
*H01L 29/45* (2006.01)
*H01L 29/66* (2006.01)
*H01L 21/268* (2006.01)
*H01L 21/285* (2006.01)
*H01L 21/324* (2006.01)
*H01L 21/311* (2006.01)

(52) U.S. Cl.
CPC ...... *H01L 21/31116* (2013.01); *H01L 21/324* (2013.01); *H01L 29/0673* (2013.01); *H01L 29/42392* (2013.01); *H01L 29/45* (2013.01); *H01L 29/66515* (2013.01); *H01L 29/66545* (2013.01); *H01L 29/66742* (2013.01); *H01L 29/78696* (2013.01)

(56) References Cited

U.S. PATENT DOCUMENTS

| | | | |
|---|---|---|---|
| 6,630,977 B1 | 10/2003 | Yamazaki et al. | |
| 9,548,381 B1* | 1/2017 | Krishnan | H01L 29/78648 |
| 10,062,692 B1 | 8/2018 | Ray et al. | |
| 10,134,856 B2 | 11/2018 | Eom et al. | |
| 2001/0050395 A1* | 12/2001 | Esaki | H01L 29/6659 |
| | | | 257/E21.628 |
| 2009/0057759 A1 | 3/2009 | Obradovic et al. | |
| 2013/0288438 A1* | 10/2013 | Jensen | H01L 21/268 |
| | | | 438/197 |
| 2014/0315356 A1 | 10/2014 | Hashimoto et al. | |
| 2016/0204061 A1* | 7/2016 | Yiu | H01L 21/78 |
| | | | 257/774 |

\* cited by examiner

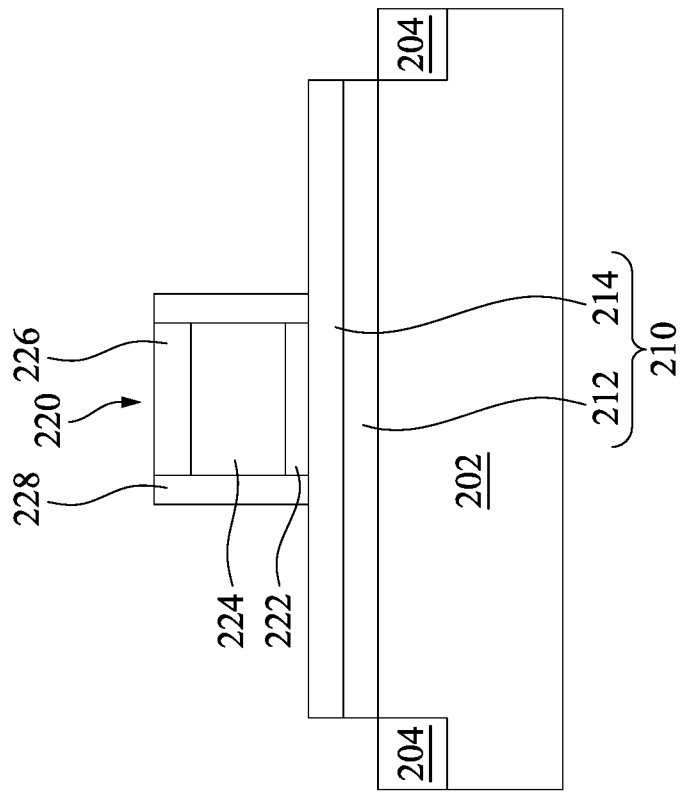

LOCALIZED PROTECTION LAYER FOR LASER ANNEALING PROCESS

BACKGROUND

Transistors are key components of integrated circuits. To satisfy the requirements of increasingly faster switching speed, drive currents of transistors need to be increasingly higher. As device size scales, contact resistance between source/drain contacts and source/drain structures of a transistor becomes a factor limiting device performance. High contact resistance causes the device drive currents to reduce, which in turn degrades transistor performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2M are cross-sectional views of a semiconductor FET device at various stages of the fabrication process, in accordance with some embodiments.

DETAILED DESCRIPTION

Figure 1:
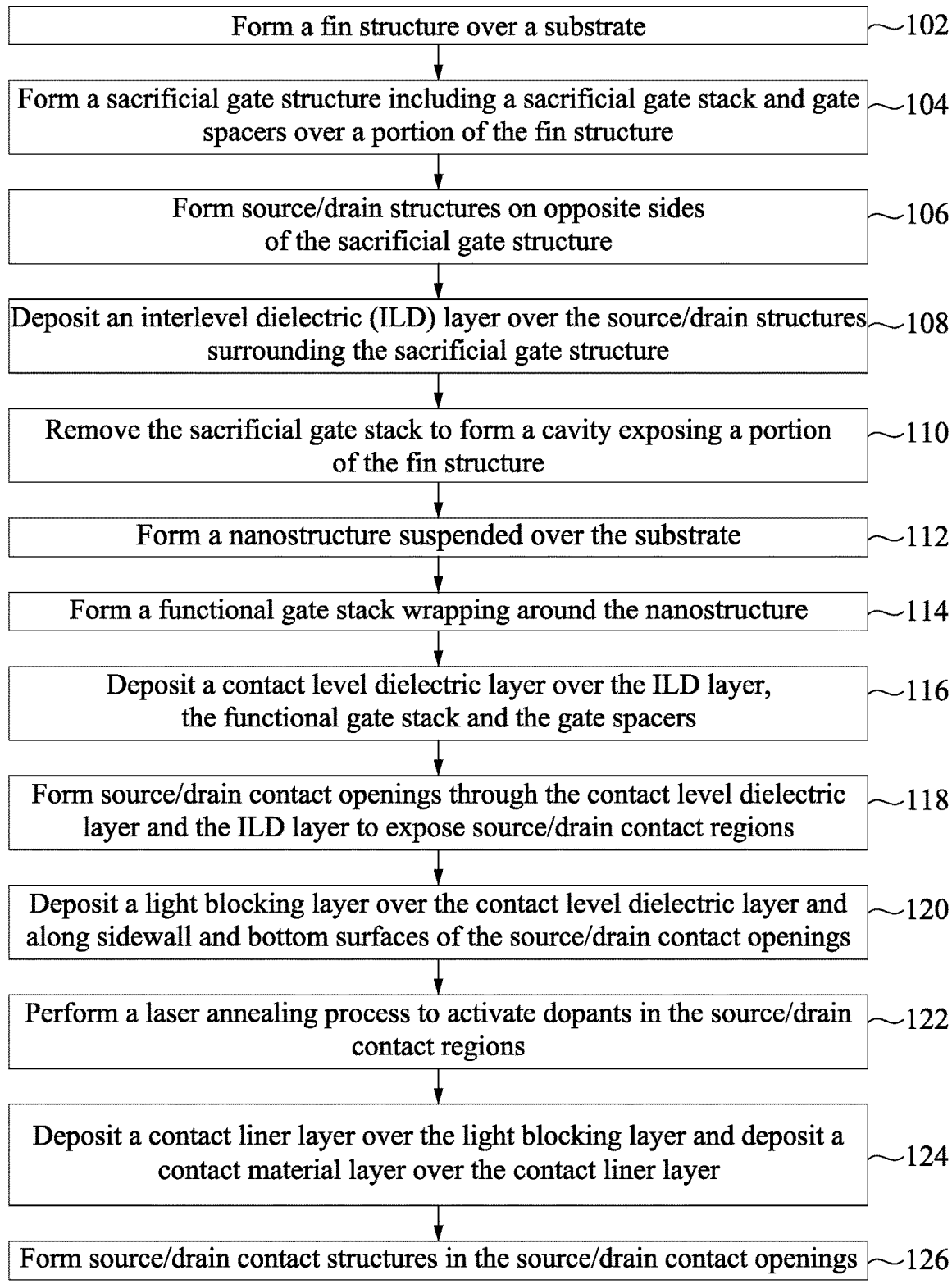
FIG. 1 is a flowchart of a method for fabricating a semiconductor field effect transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In typical field effect transistor (FET) devices, source/drain contacts are created by forming metal contacts on top of source/drain structures containing activated dopants such as phosphorous (P) or Arsenic (As) in the case of n-type FET devices and boron (B) in case of p-type FET devices. The contact resistance between the metal contacts and the source/drain structures, thus, depends on the level of activated dopants in the source/drain contact regions proximate the metal/semiconductor interfaces.

A pulsed laser annealing process is commonly used to activate dopants in the source/drain contact regions. However, the laser energy that is required for achieving sufficient dopant activation normally exceeds the desired thermal budget, causing the melting of the semiconductor channel, especially when semiconductor channel has a small dimension in case of nanowire. The melting of the semiconductor channel is detrimental to the device performance and reliability. The laser energy also heats the metal gate formed by the gate-last scheme, which adversely affects the integrity of the metal gate.

In embodiments of the present disclosure, a light blocking layer is introduced to protect regions where gate and channel structures are located from the laser annealing thermal budget when a nanosecond laser annealing process is performed to activate dopants in the source/drain contact regions. The light blocking layer either absorbs or reflects laser irradiation during the laser annealing process and, thus, helps to prevent laser irradiation from penetrating deeper into the gate and channel regions. The light blocking layer, thus, helps to avoid thermal damages to the gate and channel structures of a FET device. Furthermore, the presence of the light blocking layer allows activation of the dopants in the source/drain contact regions to be performed after the gate formation, deactivation of the dopants at the source/drain contact regions caused by the gate formation process is prevented. As a result, device performance and reliability are enhanced.

In the present disclosure, nanowire FET devices and the method of forming the same are provided in accordance with various embodiments. The intermediate stages of forming the nanowire FET devices are illustrated. The variations and the operations of the nanowire FET devices in accordance with embodiments are discussed. Throughout the various views and illustrative embodiments, like reference numbers are used to designate like elements. Although embodiments described herein are described in the context of nanowire FET devices, implementations of some embodiments of the present disclosure are usable in other processes and/or in other devices, such planar FET devices or fin FET devices.

FIG. 1 is a flowchart of a method 100 for fabricating a semiconductor FET device 200, in accordance with some embodiments. FIGS. 2A through 2M are cross-sectional views of the semiconductor FET device 200 at various stages of the fabrication process, in accordance with some embodiments. The method 100 is discussed in detail below, with reference to the semiconductor FET device 200. The flowchart illustrates only a relevant part of the entire manufacturing process for the semiconductor FET device 200. It is understood that additional operations may be provided before, during, and after the operations shown by FIG. 1, and some of the operations described below can be replaced or eliminated for additional embodiments of the method. The order of the operations/processes may be interchangeable.

Figure 2A:
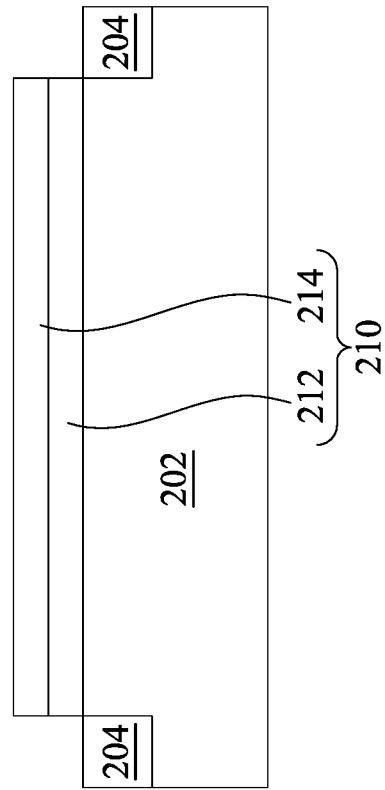

Referring to FIG. 1, at operation 102, a fin structure 210 is fabricated over a substrate 202, as shown in FIG. 2A. The fin structure 210 is formed over the substrate 202 and protrudes from isolation structures 204.

In some embodiments, the substrate 202 is a bulk semiconductor substrate. A "bulk" semiconductor substrate refers to a substrate that is entirely composed of at least one semiconductor material. In some embodiments, the bulk semiconductor substrate includes a semiconductor material or a stack of semiconductor materials such as, for example, silicon (Si), germanium (Ge), silicon germanium (SiGe), carbon doped silicon (Si:C), silicon germanium carbon (SiGeC); or an III-V compound semiconductor such as, for example, gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some embodiments, the bulk semiconductor substrate includes a single crystalline semiconductor material such as, for example, single crystalline silicon. In some embodiments, the bulk semiconductor substrate is doped depending on design requirements. In some embodiments, the bulk semiconductor substrate is doped with p-type dopants or n-type dopants. The term "p-type" refers to the addition of impurities to an intrinsic semiconductor that creates deficiencies of valence electrons. Exemplary p-type dopants, i.e., p-type impurities, include, but are not limited to, boron, aluminum, gallium, and indium. "N-type" refers to the addition of impurities that contribute free electrons to an intrinsic semiconductor. Exemplary n-type dopants, i.e., n-type impurities, include, but are not limited to, antimony, arsenic, and phosphorous. If doped, the substrate 202, in some embodiments, has a dopant concentration in a range from $1.0 \times 10^{14}$ atoms/cm$^3$ to $1.0 \times 10^{17}$ atoms/cm$^3$, although the dopant concentrations may be greater or smaller. In some embodiments, the substrate 202 is a semiconductor-on-insulator (SOI) substrate including a top semiconductor layer formed on an insulator layer (not shown). The top semiconductor layer includes the above-mentioned semiconductor material such as, for example, Si, Ge, SiGe, Si:C, SiGeC; or an III-V compound semiconductor including GaAs, GaP, InP, InAs, InSb, GaAsP, AlInAs, AlGaAs, GaInAs, GaInP, or GaInASP. The insulator layer is, for example, a silicon oxide layer, or the like. The insulator layer is provided over a base substrate, typically a silicon or glass substrate.

The fin structure 210 includes alternatively stacked first semiconductor strips 212 and second semiconductor strips 214. In some embodiments and as in FIG. 2A, the fin structure 210 includes a first semiconductor strip 212 and a second semiconductor strip 214 stacked over the first semiconductor strip 212. Although FIG. 2A illustrates a fin structure 210 comprising a single first semiconductor strip 212 and a single second semiconductor strip 214, the fin structure 210 of the present disclosure is not limited to such number of first semiconductor strips and second semiconductor strips. Instead, the fin structure 210 of the present disclosure can include any number of second semiconductor strips 214 separated from one another by first semiconductor strips 212. Furthermore, although a single fin structure 210 is illustrated in FIG. 2A, multiple fin structures are contemplated in the present disclosure.

In the following fabrication stages, the first semiconductor strips 212 will be removed from the fin structure 210 and thus are sacrificial semiconductor strips. The first semiconductor strip 212 includes any semiconductor material that can be removed selective to a semiconductor material that provides the second semiconductor strip 214. For example, in some embodiments, the first semiconductor strip 212 includes SiGe, and the second semiconductor strip 214 includes Ge. In other embodiments, the first semiconductor strip 212 includes SiGe, and the second semiconductor strip 214 includes Si. In still other embodiments, the first semiconductor strip 212 and the second semiconductor strip 214 includes SiGe with different Ge concentrations.

The fin structure 210 is formed by patterning a material stack (not shown) that includes alternatively stacked first semiconductor material layers and second semiconductor material layers. Each of the first semiconductor material layers and the second semiconductor material layers in the material stack is formed by depositing an appropriate material using an epitaxial growth process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. Each layer in the material stack, thus, has an epitaxial relationship, i.e., same crystal orientation, as that of the underlying substrate 202. Examples of various epitaxial growth processes that are suitable for use in forming layers in the material stack include, e.g., rapid thermal chemical vapor deposition (RT-CVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). In some embodiments, the epitaxial growth of the various layers in material stack is performed without breaking vacuum between the various depositions. In some embodiments, the vacuum is broken between any of the various depositions.

In some embodiments, the patterning of the material stack is performed by first applying a mask layer over a topmost surface of the material stack and lithographically patterning the mask layer to provide a patterned mask layer that covers one or more areas where the fin structure(s) 210 are to be formed. In some embodiments, the mask layer is a photoresist layer or a photoresist layer in conjunction with a hardmask layer(s). The material stack is then etched by an anisotropic etch using the patterned mask layer as an etch mask. In some embodiments, the anisotropic etch is a dry etch such as, for example reactive ion etch (ME), a wet etch, or a combination thereof. In some embodiments, the etch stops at approximately the surface of the substrate 202. In some embodiments, the etch proceeds into the substrate 202. A substrate strip 202A thus is formed beneath the first semiconductor strip 212 of the fin structure 210. After formation of the fin structure(s) 210, the patterned mask layer is removed, for example, by oxygen plasma. Alternatively, in some embodiments, other methods, such as sidewall image transfer (SIT) or directional self-assembly (DSA), are used to pattern the material stack to provide the fin structure(s) 210.

After forming the fin structure 210, isolation structures 204 is formed surrounds the substrate strips 202A such that the fin structures 210 protrudes above the isolation structures. In some embodiments, the isolation structures 204 are shallow trench isolation structures formed in the substrate 202. In some embodiments, the isolation structures 204 include silicon oxide, silicon nitride, silicon oxynitride, and/or other suitable insulating material. In some embodiments, the isolation structures 204 include a multi-layer structure, for example, having one or more thermal oxide liner layers disposed on the bottom portion of the substrate strip 202A. In some embodiments, the isolation structures 204 are formed by etching trenches in the substrate 202 and filling trenches with an insulating material using suitable deposition processes. In some embodiments, the deposition of the insulating material is performed, for example, by chemical vapor deposition (CVD), plasma enhance chemical vapor deposition (PECVD), or spin coating. In some embodiments, the isolation structures 204 include silicon oxide formed by a flowable CVD process (FCVD) during which a flowable oxide is deposited and a post-deposition anneal is then performed to convert the flowable oxide into silicon oxide. Excess deposited insulating material is subsequently removed from above the topmost surface of the fin structure 210, for example, by a chemical mechanical planarization (CMP) process. After planarization, the top surfaces of the deposited insulating material are coplanar with the topmost surface of the fin structure 210. Next, the deposited insulating material is recessed to provide the isolation structures 204.

At operation 104 of FIG. 1, a sacrificial gate structure 220 is formed over the fin structure 210, as shown in FIG. 2B. The sacrificial gate structure 220 includes a sacrificial gate stack (222, 224, 226) straddling a portion of the fin structure 210 and gate spacers 218 on sidewalls of the sacrificial gate stack (222, 224, 226). By "straddling" it is meant that a sacrificial gate stack is formed atop and along sidewalls of the fin structure 210. The term "sacrificial gate stack" as used herein refers to a placeholder structure for a subsequently formed functional gate stack. The term "functional gate stack" as used herein refers to a permanent gate stack used to control output current (i.e., flow of carriers in the channel) of a semiconducting device through electrical fields or magnetic fields. It should be noted that although a single sacrificial gate structure is described and illustrated, multiple sacrificial gate structures are contemplated in the present disclosure.

The sacrificial gate stacks (222, 224, 226) includes, from bottom to top, a sacrificial gate dielectric 222, a sacrificial gate conductor 224, and a sacrificial gate cap 226. In some embodiments, the sacrificial gate dielectric 222 is omitted. In some embodiments, the sacrificial gate stack (222, 224, 226) is formed by first providing a sacrificial material stack (not shown) that includes, from bottom to top, a sacrificial gate dielectric layer if the sacrificial gate dielectric 222 is present, a sacrificial gate conductor layer and a sacrificial gate cap layer, over the fin structure 210 and the substrate 202, and by subsequently patterning the sacrificial material stack.

If present, in some embodiments, the sacrificial gate dielectric layer includes silicon oxide, silicon nitride, or silicon oxynitride. In some embodiments, the sacrificial gate dielectric layer is formed utilizing a deposition process such as, for example, CVD or physical vapor deposition (PVD).

In some embodiments, the sacrificial gate dielectric layer is formed by conversion of a surface portion of the fin structure 210 utilizing thermal oxidation or nitridation.

In some embodiments, the sacrificial gate conductor layer includes polysilicon. In some embodiments, the sacrificial gate conductor layer is formed utilizing a deposition process such as, for example, CVD or PECVD.

In some embodiments, the sacrificial gate cap layer includes a dielectric material such as an oxide, a nitride, or an oxynitride. For example, in some embodiments, the sacrificial gate cap layer includes silicon nitride. In some embodiments, the sacrificial gate cap layer is formed utilizing a deposition process such as, for example, CVD or PECVD.

In some embodiments, the sacrificial gate material stack is patterned by lithography and etching. For example, a photoresist layer (not shown) is applied over the topmost surface of the sacrificial material stack and lithographically patterned by lithographic exposure and development. The pattern in the photoresist layer is sequentially transferred into the sacrificial material stack by at least one anisotropic etch. The anisotropic etch is a dry etch, for example RIE, a wet etch, or a combination thereof. If not completely consumed, the remaining photoresist layer after formation of the sacrificial gate stack is removed by, for example, ashing.

In some embodiments, the gate spacers 228 include a dielectric material such as, for example, an oxide, a nitride, an oxynitride, or combinations thereof. In some embodiments, the gate spacers 228 comprise silicon nitride. In some embodiments, the gate spacers 228 are formed by first depositing a conformal gate spacer material layer (not shown) on exposed surfaces of the sacrificial gate stack (222, 224, 226), the fin structure 210 and the substrate 202 and then etching the gate spacer material layer to remove horizontal portions of the gate spacer material layer. In some embodiments, the gate spacer material layer is deposited, for example, by CVD, PECVD, or atomic layer deposition (ALD). In some embodiments, the gate spacer material layer is etched by dry etch such as, for example, ME. Vertical portions of the gate spacer material layer present on the sidewalls of sacrificial gate stack (222, 224, 226) constitute the gate spacers 228.

Figure 2C:
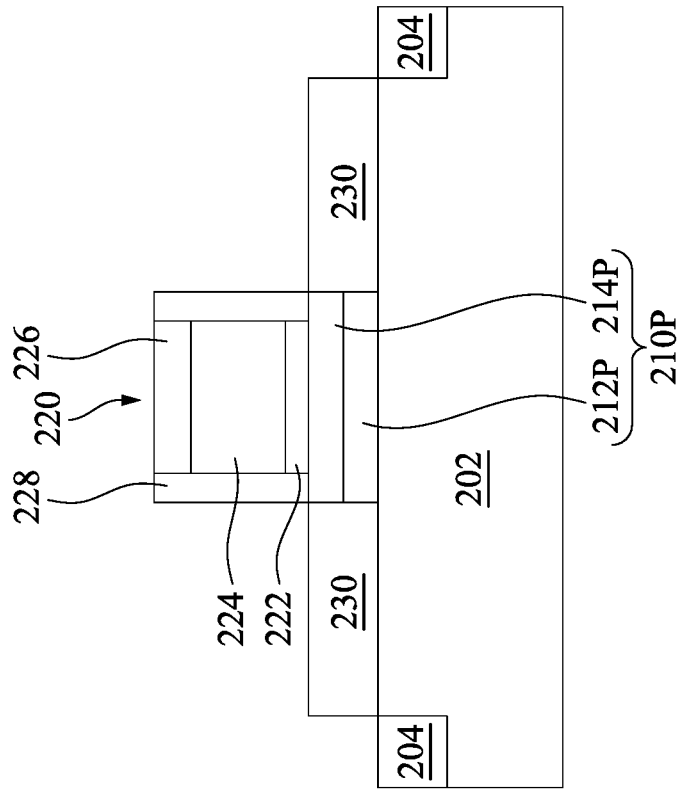

At operation 106 of FIG. 1, a source structure and a drain structure (collectively referred to as source/drain structures 230) are formed on opposite sides of the sacrificial gate structure 220, as shown in FIG. 2C. The source/drain structures 230 are highly doped semiconductor regions with a dopant concentration from about $1\times10^{19}$ atoms/cm$^3$ to about $2\times10^{21}$ atoms/cm$^3$, although lesser or greater dopant concentrations are also contemplated.

In some embodiments, the source/drain structures 230 are formed by implanting dopants into portions of the fin structure 210 that are not covered by the sacrificial gate structure 220. In some embodiments and when the resulting semiconductor FET device 200 is an n-type FET device, n-type dopants such as phosphorus or arsenic are doped in the source/drain structures 230. In some other embodiments and when the resulting semiconductor FET device 200 is a p-type FET device, p-type dopants such as boron or BF$_2$ are doped in the source/drain structures 230.

Alternatively, the source/drain structures 230 are formed by, for example, epitaxial growth. In some embodiments, the epitaxial source/drain structures function as source/drain stressor to enhance carrier mobility of the semiconductor FET device 200. In some embodiments and when the resulting semiconductor FET device 200 is an n-type FET device, the source/drain structures 230 includes SiP, SiC, SiPC, Si, III-V compound semiconductor materials, or combinations thereof. In some other embodiments and when the resulting semiconductor FET device 200 is a p-type FET device, the source/drain structures 230 includes SiGe, SiGeC, Ge, Si, III-V compound semiconductor materials, or combinations thereof.

In some embodiments, when forming the source/drain structures 230 by epitaxial growth, portions of the fin structure 210 not covered by the sacrificial gate structures 220 are first removed to provide a fin structure portion 210P beneath the sacrificial gate structures 220. The fin structure portion 210P includes a first semiconductor segment 212P and a second semiconductor segment 214P, which are remaining portions of the first semiconductor strip 212 and the second semiconductor strip 214, respectively. In some embodiments, the portions of the fin structure 210 that are exposed by the sacrificial gate structure 220 are removed using an anisotropic etch that etches the semiconductor materials of the first semiconductor strip 212 and the second semiconductor strip 214 without substantially affecting the surrounding structures, including the substrate 202, the sacrificial gate cap 226, and the gate spacers 228. In some embodiments, the anisotropic etch is a dry etch, such as RIE. Subsequently, a semiconductor material is epitaxially deposited on exposed semiconductor surfaces such as surface of the substrate 202, the first semiconductor segment 212P, and the second semiconductor segment 214P, but not on dielectric surfaces such as surfaces of the isolation structures 204, the sacrificial gate cap 226, and the gate spacers 228. In some embodiments, when multiple fin structures 210 are present, the epitaxial growth process continues until the deposited semiconductor material merges adjacent fin structure portions 210P. Depending on the types of the semiconductor FET device 200 being formed (i.e., p-type FET or n-type FET), in the embodiments where the resulting semiconductor FET device 200 is a p-type FET device, the source/drain structures 230 include p-type dopants such as boron or $BF_2$, and in the embodiments where the resulting semiconductor FET device 200 is an n-type FET device, the source/drain structures 230 include n-type dopants such as phosphorous or arsenic. In some embodiments, the source/drain structures 230 are in-situ doped with n-type or p-type dopants during the epitaxial growth. In some embodiments, the source/drain structures 230 are undoped during the epitaxial growth process, and are doped during a subsequent doping process. The subsequent doping process is achieved by an ion implantation, plasma immersion ion implantation, gas and/or solid source diffusion, other suitable processes, and/or combinations thereof. In some embodiments, the source/drain structures 230 include phosphorous doped SiC for an n-type FET device. In some embodiments, the source/drain structures 230 include boron doped SiGe for a p-type FET device.

In some embodiments, the source/drain structures 230 are further exposed to an annealing process to activate the dopants in the source/drain structures 230 after forming the source/drain structures 230 and/or after the subsequent doping process. In some embodiments, the dopants in the source/drain structures 230 are activated by a thermal annealing process including a rapid thermal annealing process, a laser annealing process, or a furnace annealing process.

Figure 2D:
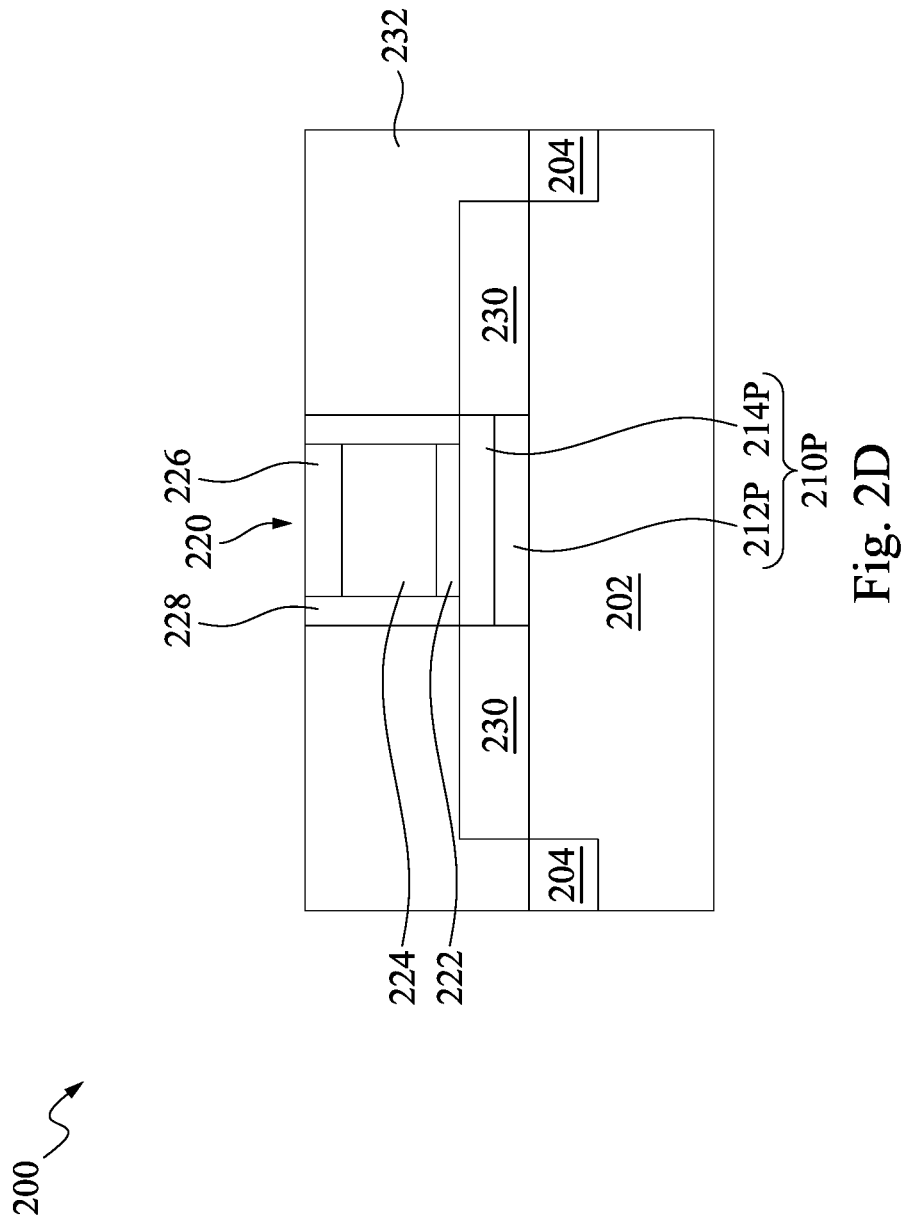

At operation 108 of FIG. 1, an interlevel dielectric (ILD) layer 232 is deposited over the source/drain structures 230 surrounding the sacrificial gate structure 220, as shown in FIG. 2D.

In some embodiments, the ILD layer 232 includes silicon oxide. Alternatively, in some embodiments, the ILD layer 232 includes a low-k dielectric material having a dielectric constant (k) less than 4. In some embodiments, the low-k dielectric material has a dielectric constant from about 1.2 to about 3.5. In some embodiments, the ILD layer 232 includes tetraethylorthosilicate (TEOS) oxide, undoped silicate glass, or doped silicate glass such as borophosphosilicate glass (BPSG), fluorosilica glass (FSG), phosphosilicate glass (PSG), boron doped silicon glass (BSG), and/or other suitable dielectric materials. In some embodiments, the ILD layer 232 is deposited by CVD, PECVD, PVD, or spin coating. In some embodiments, the ILD layer 232 is deposited to have a top surface above the topmost surface of the sacrificial gate structure 220 (e.g., the top surface of the sacrificial gate cap 226). The ILD layer 232 is subsequently planarized, for example, by CMP and/or a recess etch using the sacrificial gate cap 226 as a polishing and/or etch stop. After the planarization, the ILD layer 232 has a surface coplanar with the topmost surface of the sacrificial gate structure 220.

Figure 2E:
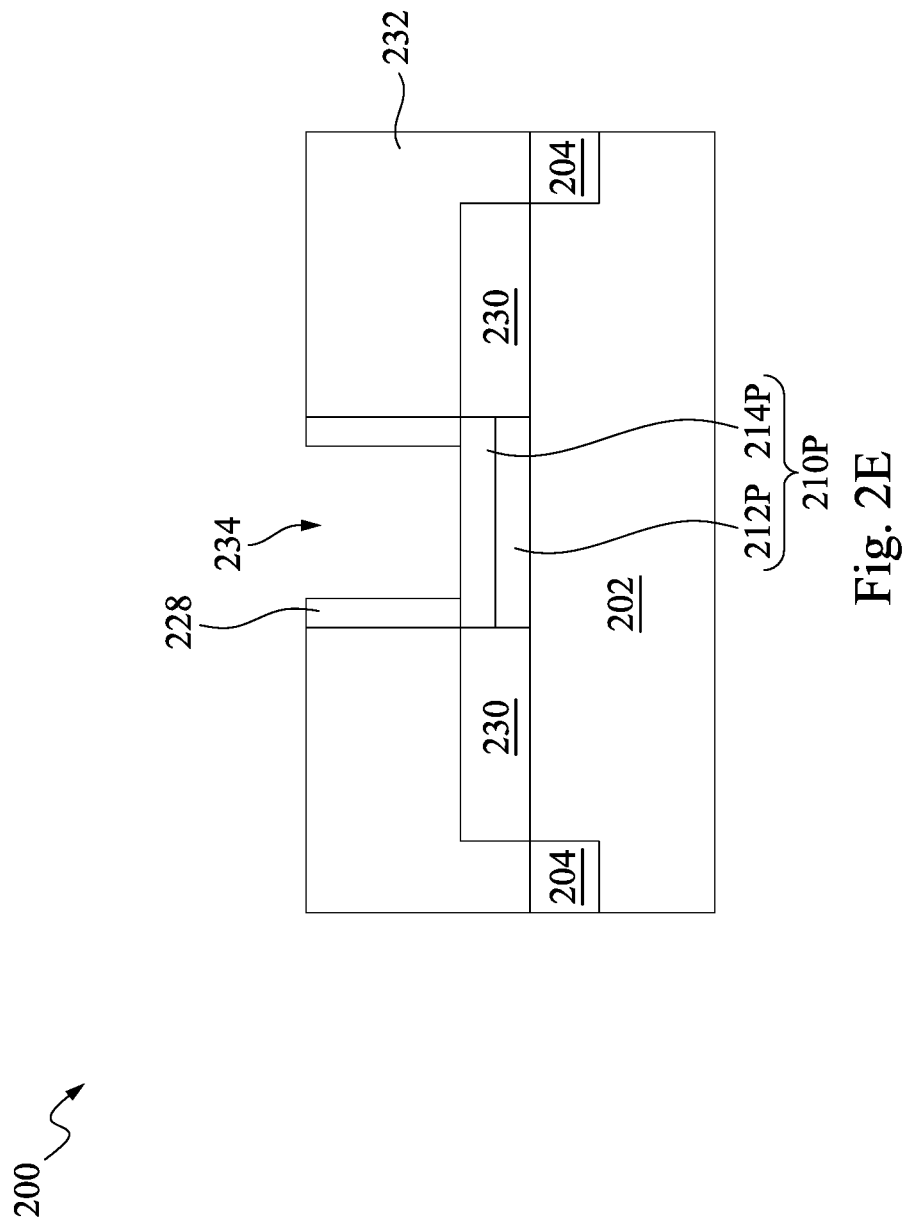

At operation 110 of FIG. 1, the sacrificial gate stack (222, 224, 226) is removed to provide a cavity 234, as shown in FIG. 2E.

Various components of the sacrificial gate stack (222, 224, 226) are removed selectively to the semiconductor material that provides the first semiconductor segment 212P and the second semiconductor segment 214P, and the dielectric materials that provide the gate spacers 228 and the ILD layer 232 by at least one etch. In some embodiments, the at least one etch is a dry etch such as ME, a wet etch such as an ammonia etch, or a combination thereof. The cavity 234 occupies a volume from which the sacrificial gate stack (222, 224, 226) is removed and is laterally confined by inner sidewalls of the gate spacers 228. After removal of the sacrificial gate stack (222, 224, 226), sidewalls of the second semiconductor segment 214P and the underlying first semiconductor segment 212P are physically exposed by the cavity 234.

Figure 2F:
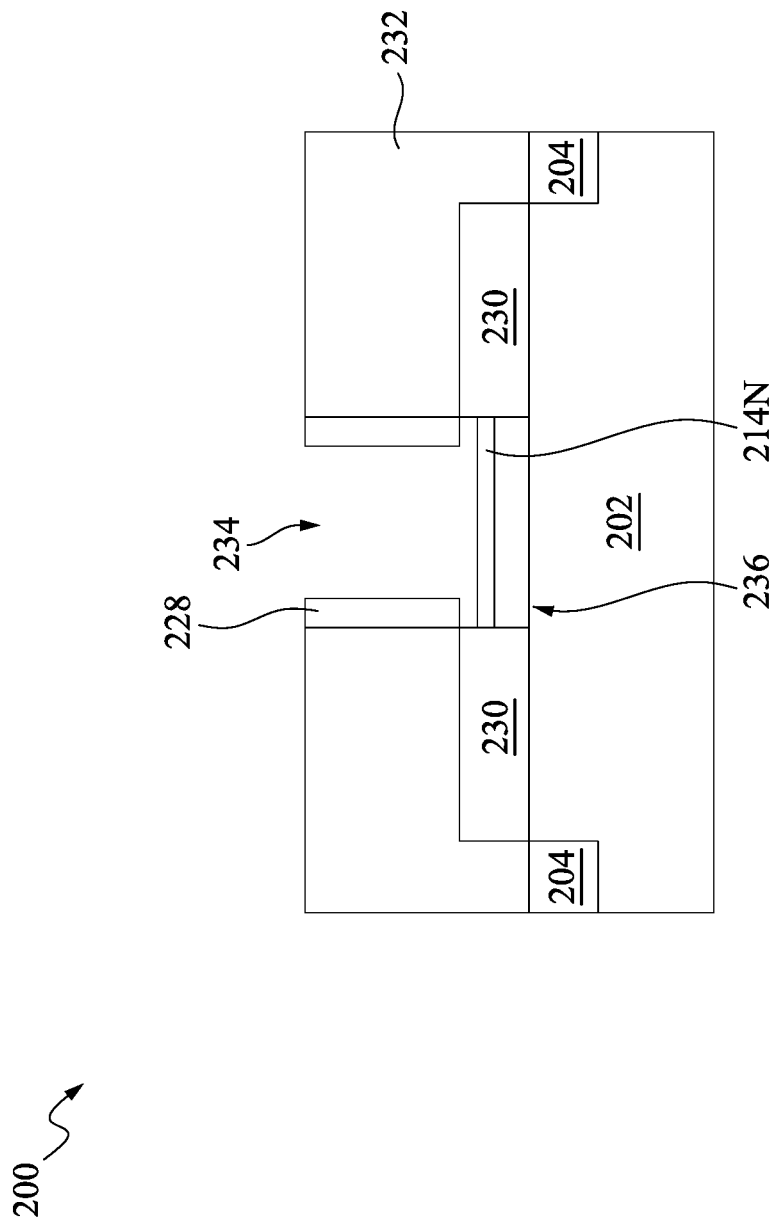

At operation 112 of FIG. 1, a nanowire structure 214N is formed to suspend over the substrate 202, as shown in FIG. 2F. It should be noted that although nanowires are described, other nanostructures, such as nanosheets or nanobars, are also contemplated in the present disclosure.

To form the nanostructure 214N, the first semiconductor segment 212P is removed by etching. In some embodiments, the etch is an isotropic etch that removes the first semiconductor segment 212P selective to the second semiconductor segment 214P, the substrate 202, and the source/drain structures 230, causing the second semiconductor segment 214P to be suspended over the substrate 202. After etching, a gap 236 is formed between the substrate 202 and the second semiconductor segment 214P. Subsequently, the second semiconductor segment 214P is thinned and rounded by performing an annealing process in a hydrogen-containing atmosphere or through oxidation, and thereby provides the nanowire structure 214N. In some embodiments, the nanowire structure 214N has a circular-shaped or an elliptical-shaped cross section. In instances where the fin structure 210 includes multiple first and second semiconductor strips 212, 214, a plurality of vertically stacked nanowire structures are formed (not shown).

Figure 2G:
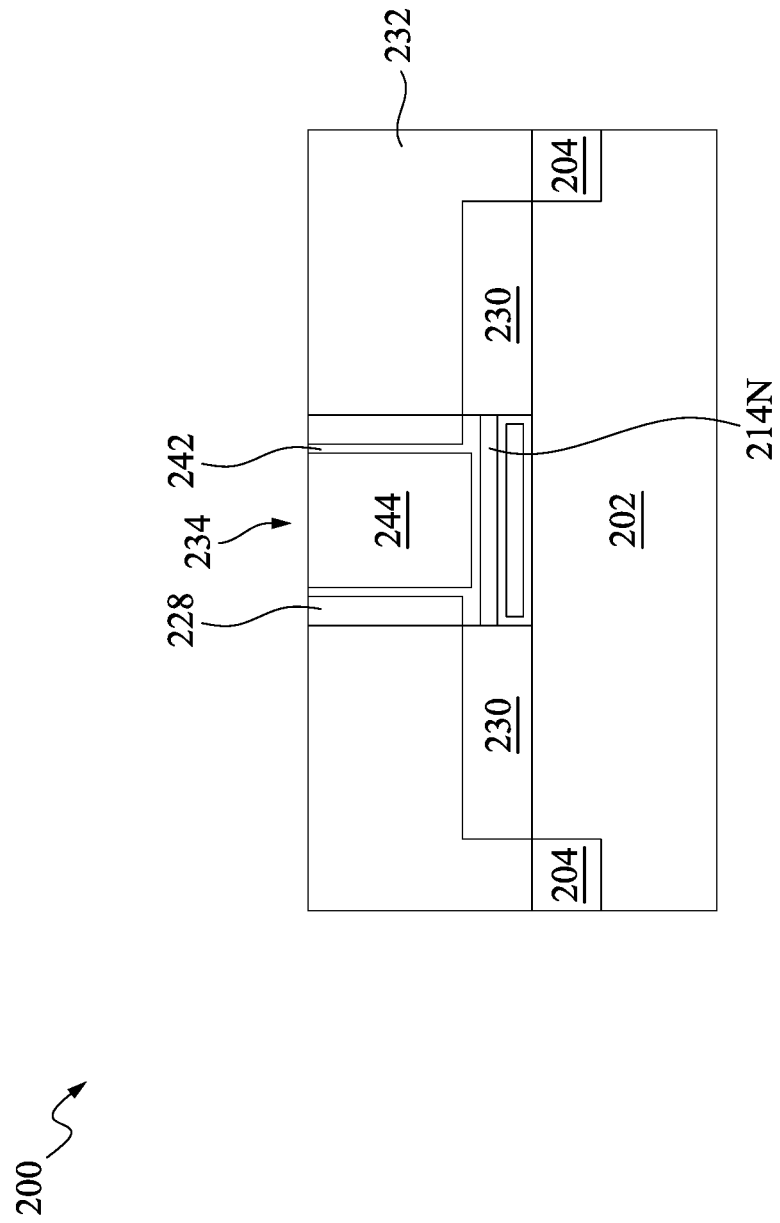

At operation 114 of FIG. 1, a functional gate stack (242, 244) is formed within the cavity 234 and the gap 236 between the nanowire structure 214N and the substrate 202, as shown in FIG. 2G. The functional gate stack (242, 244) wraps around the nanowire structure 214N, forming a gate all around (GAA) nanowire FET device. In some embodiments, the functional gate stack (242, 244) includes a gate dielectric 242 over exposed surfaces of the nanowires structure 214N and a gate electrode 244 over the gate dielectric 242. The functional gate stack (242, 244) and the gate spacers 228 laterally surrounding the functional gate stack (242, 244) together define a functional gate structure (242, 244, 228).

The functional gate stack (242, 244) includes a first portion within the cavity 234 and a second portion within the gap 236. In the cavity 234, the gate dielectric 242 is U-shaped having a horizontal portion in direct contact with an upper surface of the nanowire structure 214N and vertical portions that are located on exposed sidewalls of the gate spacers 228 laterally surrounding the cavity 234. Within the gap 236, the gate dielectric 242 surrounds the gate electrode 244.

In some embodiments, the gate dielectric 242 includes a high-k dielectric material having a dielectric constant greater than silicon oxide. Exemplary high-k dielectric materials include, but are not limited to, hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum Aluminum oxide ($LaAlO_3$), and yttrium oxide ($Y_2O_3$). In some embodiments, a multilayered gate dielectric structure comprising different gate dielectric materials, e.g., silicon oxide, and a high-k gate dielectric is formed. In some embodiments, the gate electrode 244 includes a conductive metal such as, for example, tungsten (W), copper (Cu), aluminum (Al), cobalt (Co), or alloys thereof.

To form the functional gate stack (242, 244), a gate dielectric layer is deposited over exposed surfaces of the ILD layer 232, the cavity 234 and the gap 236. In some embodiments, the gate dielectric layer is deposited by a suitable conformal deposition process such as CVD or ALD. A conductive material layer is the deposited over the gate dielectric layer to fill the cavity 234 and the gap 236. In some embodiments, the conductive material layer is deposited by CVD, PECVD, or PVD. A planarization process, such as CMP is performed to remove portions of the conductive material layer and the gate dielectric layer from the top surface of the dielectric layer. The remaining portion of the conductive material layer within the cavity 234 and the gap 236 constitutes the gate electrode 244, and the remaining portion of the gate dielectric layer within the cavity 234 and the gap 236 constitutes the gate dielectric 242.

Figure 2H:
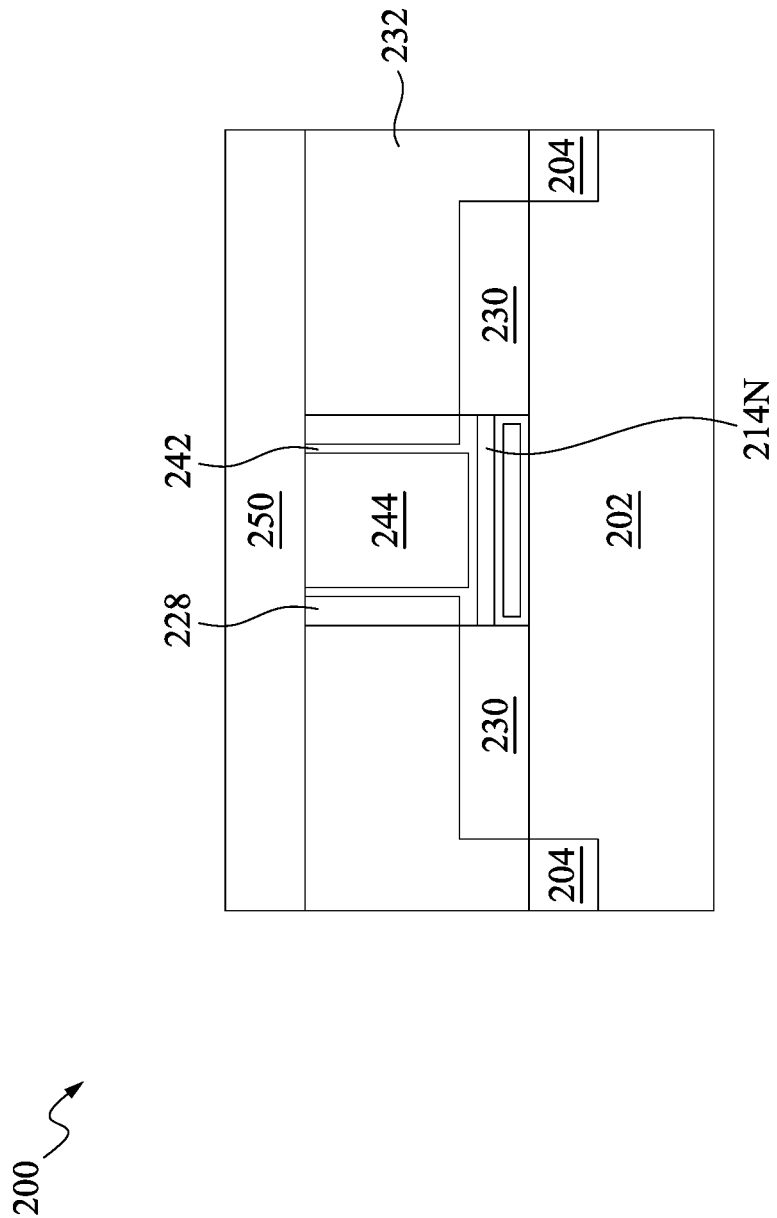

At operation 116 of FIG. 1, a contact level dielectric layer 250 is deposited over the ILD layer 232 and the functional gate structure (242, 244, 228), as shown in FIG. 2H.

In some embodiments, the contact level dielectric layer 250 includes a dielectric material such as, for example, silicon dioxide, TEOS, undoped silicate glass, or doped silicate glass such as BPSG, FSG, PSG, or BSG. In some embodiments, the contact level dielectric layer 250 includes a dielectric material the same as the dielectric material of the ILD layer 232. In some embodiments, the contact level dielectric layer 250 includes a dielectric material different from the dielectric material of the ILD layer 232. In some embodiments, the contact level dielectric layer 250 is deposited, for example, using CVD, PECVD, PVD, or spin coating. In some embodiments, if the contact level dielectric layer 250 is not self-planarizing, a top surface of the contact level dielectric layer 250 is planarized, for example, by CMP. The planarized top surface of the contact level dielectric layer 250 is located above topmost surfaces of the functional gate structures (242, 244, 228).

Figure 2I:
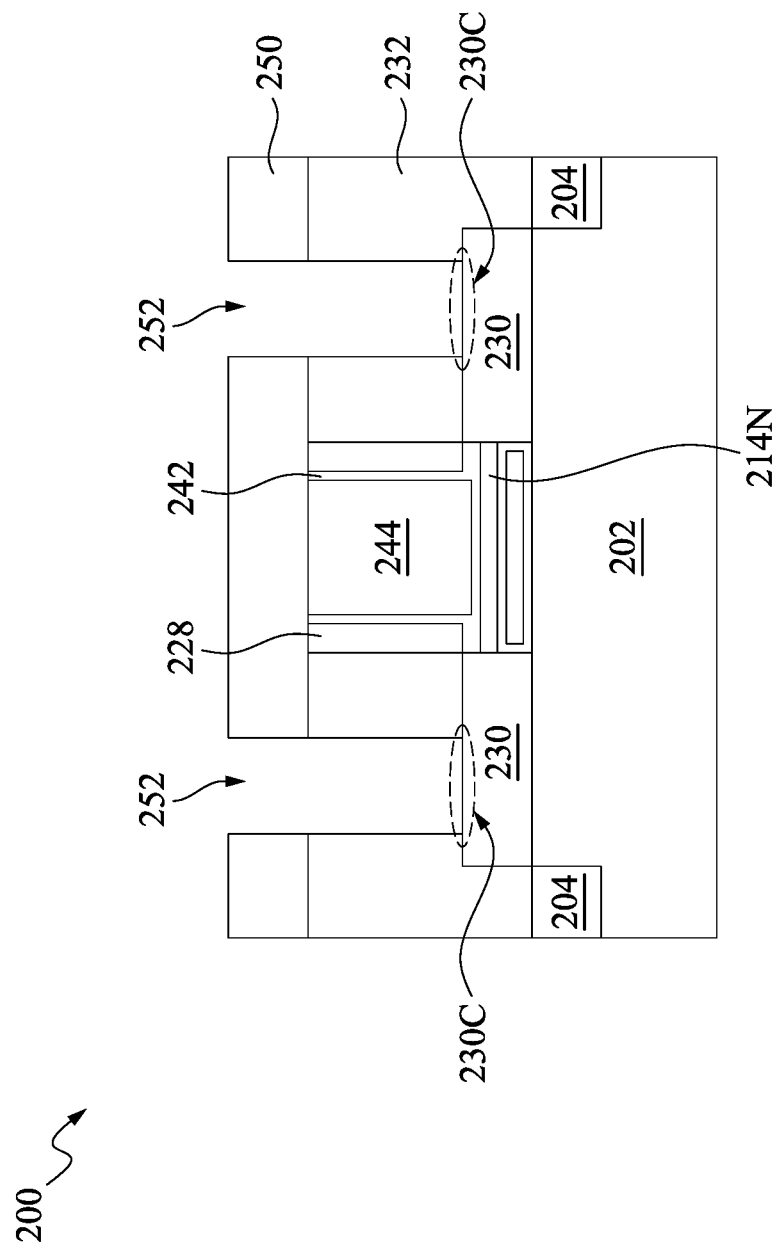

At operation 118 of FIG. 1, source/drain contact openings 252 are formed within the contact level dielectric layer 250 and the ILD layer 232, as shown in FIG. 2I. Each of the source/drain contact openings 252 extends through the contact level dielectric layer 250 and the ILD layer 232, exposing a portion of a corresponding source/drain structure 230. Portions of the source/drain structures 230 that are exposed by respective source/drain contact openings 252 are herein referred to as source/drain contact regions 230C.

In some embodiments, the source/drain contact openings 252 are formed by applying a photoresist layer over the contact level dielectric layer 250, and then lithographically patterning the photoresist layer to form openings therein. Each opening overlies a portion of one of the source/drain structures 230. The pattern in the photoresist layer is transferred through the contact level dielectric layer 250 and the ILD layer 232 using an anisotropic etch to form the source/drain contact openings 252. In some embodiments, a dry etch such as, for example, RIE or plasma etch is performed to remove exposed portions of the contact level dielectric layer 250 and the ILD layer 232. In some embodiments and as shown, the source/drain contact openings 252 are formed to have substantially vertical sidewalls. In some embodiments, the source/drain contact openings 252 are formed to have tapered sidewalls. After formation of the source/drain contact openings 252, the remaining photoresist layer is removed, for example, by ashing.

Figure 2J:
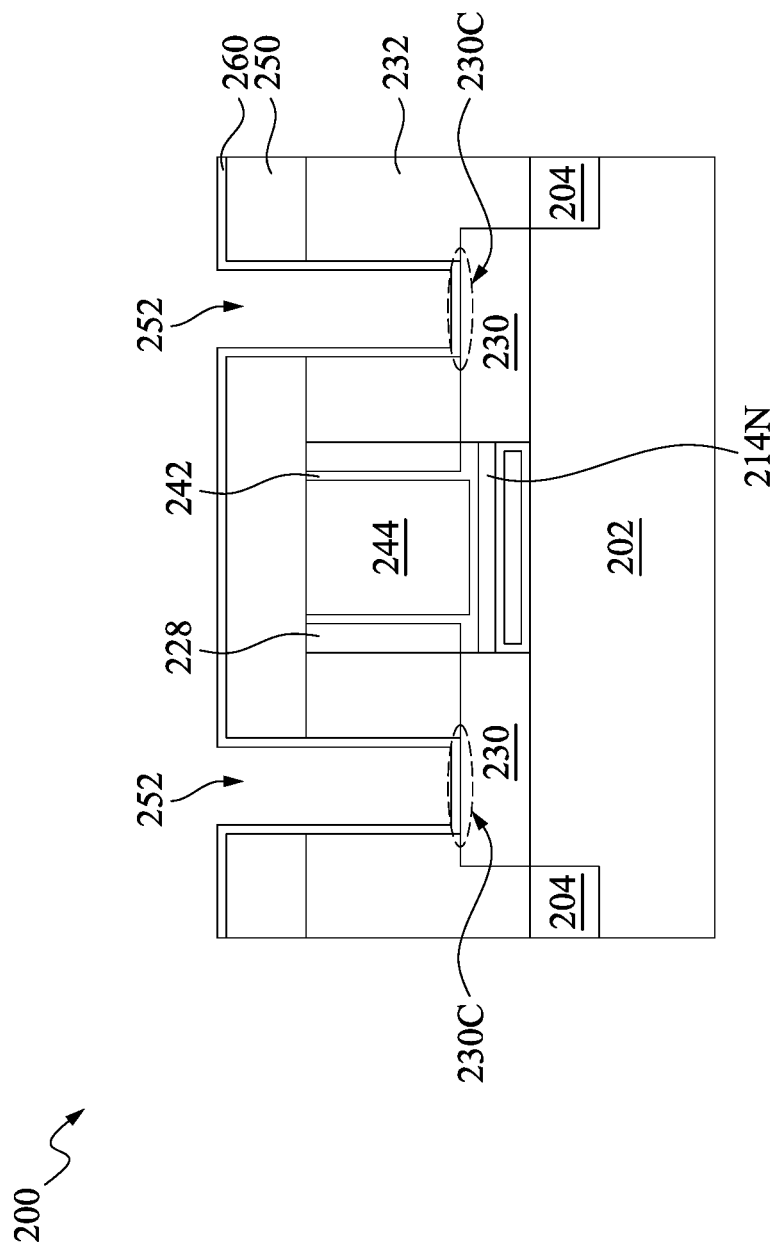

At operation 120 of FIG. 1, a light blocking layer 260 is deposited over the contact level dielectric layer 250 and along sidewall and bottom surfaces of the source/drain contact openings 252, as shown in FIG. 2J. The light blocking layer 260 is employed to allow laser irradiation only to penetrate into surface portions of the source/drain contact regions 230C and the contact level dielectric layer 250, thereby reducing the likelihood of thermal damage to the functional gate structure (242, 244, 228) and the nanowire structure 214N during a laser annealing process subsequently performed to activate dopants in the source/drain contact regions 230C. The light blocking layer 260 thus protects the underlying FET device components from thermal damage.

In some embodiments, the light blocking layer 260 is an absorption layer configured to absorb incident laser irradiation, thus preventing the laser irradiation from penetrating deeper into regions where the functional gate structure (242, 244, 228) and the nanowire structure 214N are located. In some embodiments, the light blocking layer 260 includes a material having a relatively high absorption coefficient at the laser irradiation wavelength. In some embodiments, the light blocking layer 260 includes Si, Ge, Al, chromium (Cr), Cu, gold (Au), or iron (Fe).

In some embodiments and as in FIG. 2J, the light blocking layer 260 is deposited using a conformal deposition process such as ALD, CVD, or PECVD. As a result, the light blocking layer 260 has a substantially uniform thickness along the sidewalls of the source/drain contact openings 252 and also along the bottom surfaces of the source/drain contact openings 252 and the top surface of the contact level dielectric layer 250. In some embodiment, the light blocking layer 260 is deposited using a non-conformal deposition process such as PVD. As a result, the thickness of horizontal portions of the light blocking layer 260 on the top surface of the contact level dielectric layer 250 and the bottom surfaces of source/drain contact openings 252 is greater than the thickness of vertical portions of the light blocking layer 260 on the sidewalls of the source/drain contact openings 252.

In some embodiments, the light blocking layer 260 is deposited to have a thickness from about 5 nm to about 10 nm. If the thickness of the light blocking layer 260 is too small, the light blocking layer 260 is unable to sufficiently absorb the laser irradiation so as to prevent the laser irradiation from penetrating deeper into regions where the functional gate structure (242, 244, 228) and nanowire structure 214N are located, and the risk of thermal damage to the functional gate structure (242, 244, 228) and nanowire structure 214N increases, in some instances. If the thickness of the light blocking layer 260 is too great, the laser irradiation is unable to effectively heat the source/drain contact regions 230C, and the total time necessary to achieve the desired dopant activation level is increased, in some instances.

Figure 2K:
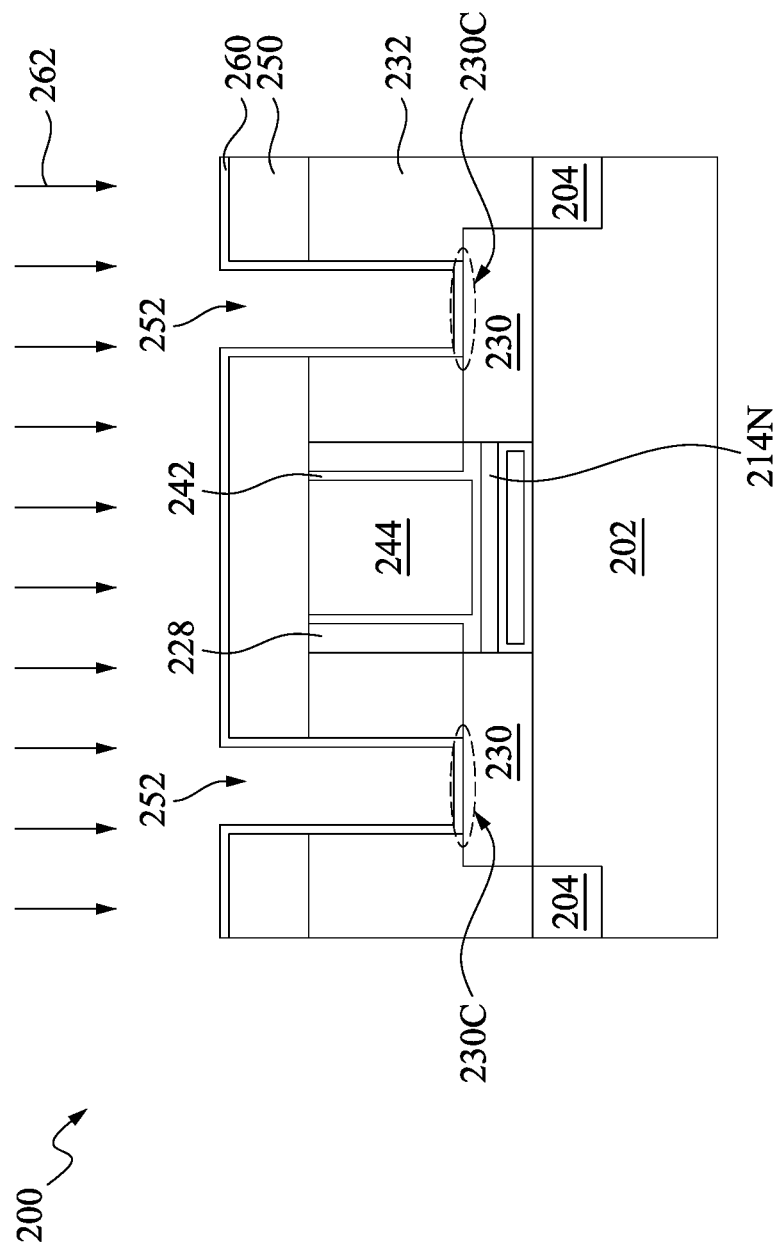

At operation 122 of FIG. 1, a laser annealing process is performed to activate dopants in the source/drain contact regions 230C, as shown in FIG. 2K. In some embodiments, the laser annealing process is performed using a laser source that directs laser irradiation, as illustrated by arrows 262, to the semiconductor FET device 200. In some embodiments, the laser source is pulsed in a nanosecond duration to cause thermal activation of the dopants in the surface regions of the source/drain contact regions 230C, while not causing any thermal damage to the functional gate structure (242, 244, 228) and the nanowire structure 214N. In some embodiments, the penetration depth of the laser irradiation 262 through light blocking layer 260 is controlled to be no greater than 10 nm, thus preventing over-heating the gate structure (242, 244, 228) and the nanowire structure 214N.

In some embodiments, the laser irradiation 262 is performed by irradiating a single laser pulse or a plurality of laser pulses that impinges onto the light blocking layer 260. In some embodiments, the total duration of the single laser pulse or the plurality of laser pulses is less than 200 nanoseconds (ns). In some embodiments, the total duration of the single laser pulse or the plurality of laser pulses is in a range from about 1 ns to about 60 ns.

The wavelength and intensity of the laser irradiation 262 are selected depending on material characteristics of the light blocking layer 260. The laser source is chosen such that the laser irradiation 262 has a wavelength at which the light blocking layer 260 has a relatively high absorption coefficient so that the laser irradiation 262 can be sufficiently absorbed by the light blocking layer 260 to prevent the deeper penetration of the laser irradiation 262 into regions where the functional gate structure (242, 244, 228) and the nanowire structure 214N are located. As a result, the functional gate structure (242, 244, 228) and the nanowire structure 214N are not over-heated during the laser annealing process, and the thermal damage the functional gate structure (242, 244, 228) and the nanowire structure 214N caused by the laser annealing is prevented. In some embodiments, the laser irradiation 262 has a wavelength from about 300 nm to about 600 nm. In some embodiments, the energy of the laser irradiation 262 is from about 0.05 $J/cm^2$ to about 0.2 $J/cm^2$. In some embodiments, an excimer laser such as a XeCl laser, a KrF laser is used.

Because the light blocking layer 260 absorbs heat from laser irradiation 262, the energy that actually reaches the functional gate structure (242, 244, 228) and the nanowire structure 214N is reduced. The light blocking layer 260 helps to protect the functional gate structure (242, 244, 228) and the nanowire structure 214N from laser annealing thermal budget, thus avoiding thermal damage to the functional gate structure (242, 244, 228) and the nanowire structure 214N. In addition, due to the presence of the light blocking layer 260, the dopants in the source/drain contact regions 230C is able to be activated after formation of the functional gate structure (242, 244, 248) without causing any damage to the functional gate structure (242, 244, 248). In addition, because the introduction of the light blocking layer 260 allows performing dopant activation in the source/drain contact regions 230C after formation of the functional gate structure (242, 244, 248), the deactivation of the dopants in the source/drain contact regions 230C caused by the functional gate formation process is prevented. As a result, the device performance are increased.

In some embodiments, after the laser annealing process, the light blocking layer 260 is removed, exposing sidewalls and bottom surfaces of the source/drain contact openings 252 (not shown).

If the light blocking layer 260 is not removed, in some embodiments, after the laser annealing process, the structure is annealed at a temperature from about 350° C. to about 450° C. The thermal annealing causes the reaction of metal in the light blocking layer 260 and silicon or germanium in the source/drain contact regions 230C to form silicide or germicide at the surface portions of the source/drain contact regions 230C. The silicide or germicide helps to reduce contact resistance between source/drain contact structures subsequently formed in source/drain contact openings 252 and the source/drain contact regions 230C. The silicide formation is optional, and is omitted in some embodiments.

Figure 2L:
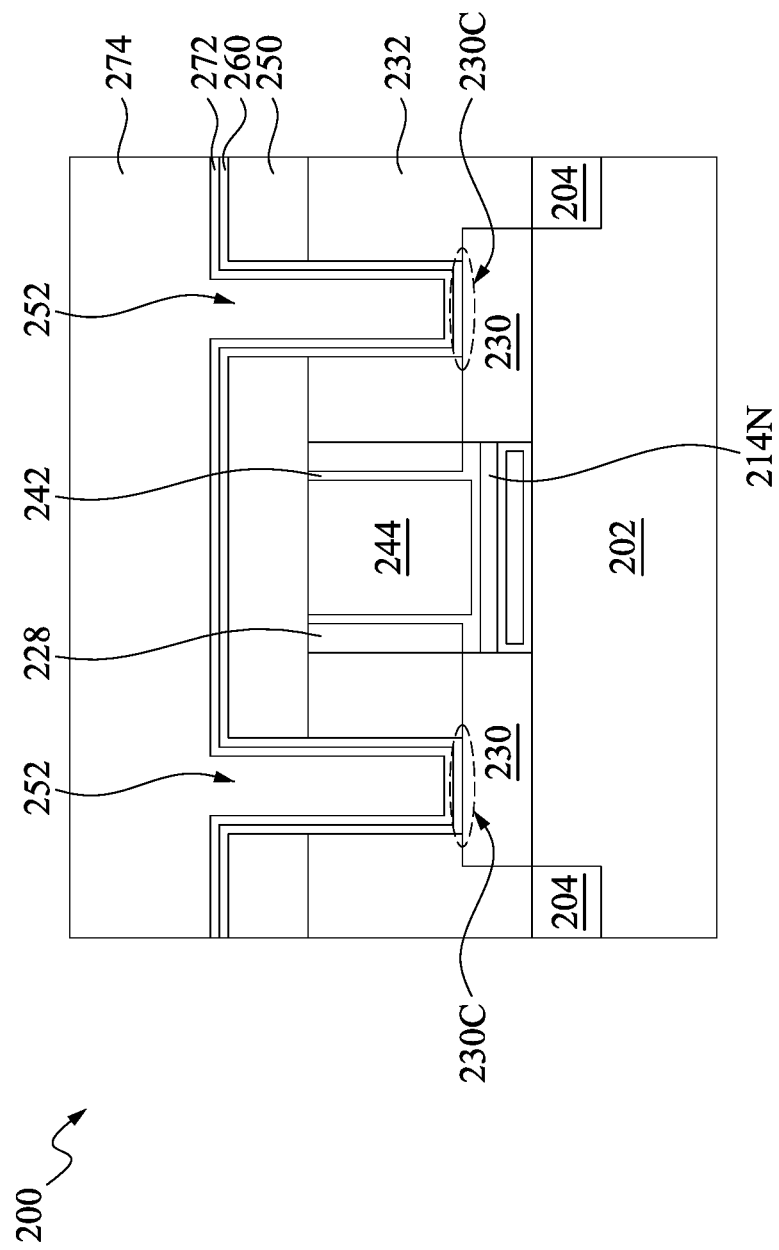

At operation 124 of FIG. 1, a contact liner layer 272 is deposited over the light blocking layer 260, followed by depositing a contact material layer 274 over the contact liner layer 272, as shown in FIG. 2L. The contact material layer 274 fills remaining volumes of the source/drain contact openings 252. In instances where the light blocking layer 260 is removed, the contact liner layer 272 is deposited directly over the sidewalls and bottom surfaces of the source/drain contact openings 252.

The contact liner layer 272 includes an elemental metal or a metallic compound that prevents diffusion of metal in the contact material layer 274 into the contact level dielectric layer 250 and the ILD layer 232. In some embodiments, the contact liner layer 272 includes titanium (Ti), tantalum (Ta), nickel (Ni), ruthenium (Ru), titanium nitride (TiN), tantalum nitride (TaN), ruthenium nitride (RuN), an alloy thereof, or a stack thereof such as Ti/TiN or Ta/TaN. In some embodiments, the contact liner layer 272 is deposited using a conformal deposition process including, for example, CVD, PECVD, PVD, or ALD.

In some embodiments, the contact material layer 274 includes a conductive metal such as, for example, Cu, W, Al, Co, or an alloy thereof. In some embodiments, the contact material layer 274 is formed utilizing a deposition process such as, for example, CVD, PECVD, PVD, or plating. The deposition process is continued until the contact material layer 274 fills the source/drain contact openings 252 and extends above the contact level dielectric layer 250. In some embodiments when Cu or a Cu alloy is employed in the contact material layer 274, an optional plating seed layer (not shown) is formed on the contact liner layer 272 prior to the formation of the conductive layer 274. In some embodiments, the optional plating seed layer is formed by a deposition process including, for example, CVD, PECVD, ALD, and PVD.

Figure 2M:
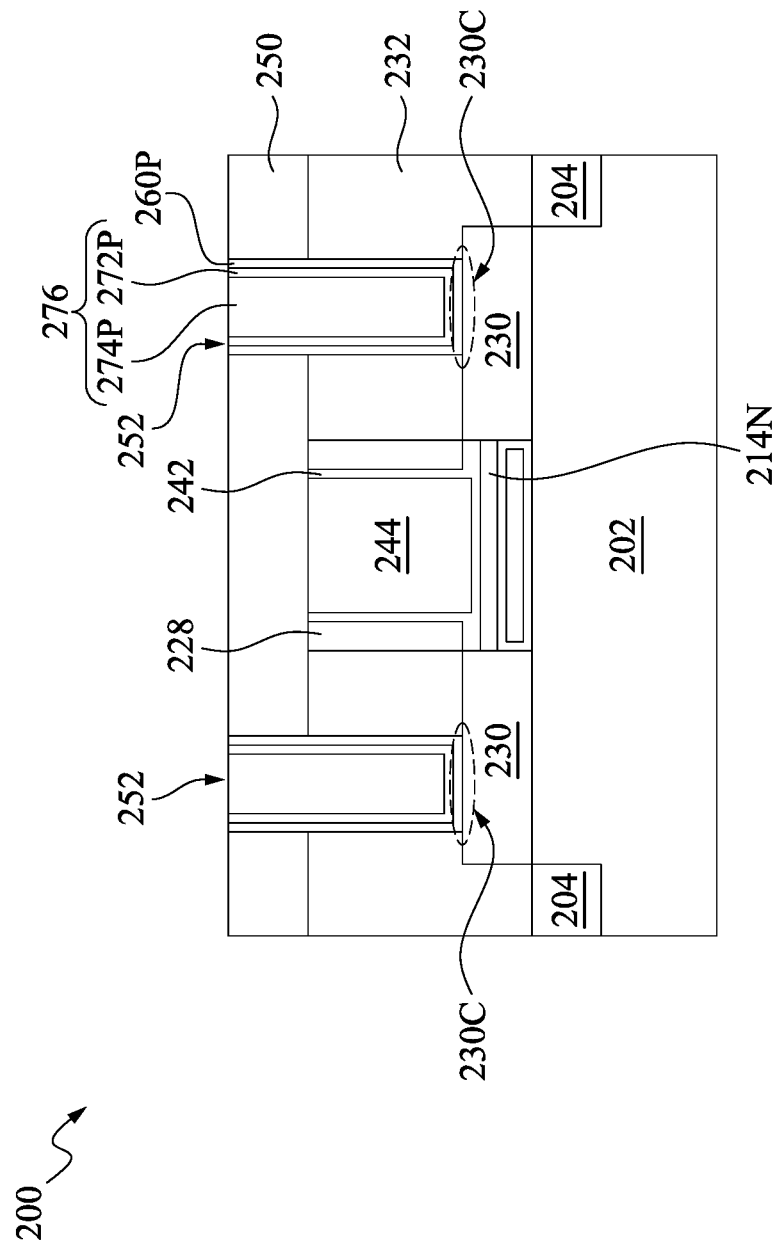

At operation 126, portions of the contact material layer 274, the contact liner layer 272, and the light blocking layer 260 that are located above the top surface of the contact level dielectric layer 250 are removed using a planarization process, as shown in FIG. 2M. In some embodiments, a CMP process is performed. After the planarization, a portion of the contact material layer 274 remaining in each source/drain contact opening 252 constitutes a contact plug 274P, a portion of the contact liner layer 272 remaining in each source/drain contact openings 252 constitutes a contact liner 272P, and a portion of a portion of the light blocking layer 260 remaining in each source/drain contact openings 252 constitutes a light blocking portion 260P. Top surfaces of the contact plug 274P, the contact liner 272P, and the light blocking portion 260P within each source/drain contact opening 252 are coplanar with the top surface of the contact level dielectric layer 250.

Source/drain contact structures 276 are, thus, formed within the source/drain contact openings 252, contacting the source/drain contact regions 230C. Each of the source/drain contact structures 276 includes a contact liner 272P and a contact plug 274P surrounded by the contact liner 272P and is surrounded by a corresponding light blocking portion 260P. Within each source/drain contact opening 252, the light blocking portion 260P is present on sidewalls and a bottom surface of a corresponding source/drain contact opening 252, and the contact liner 272P is present over the light blocking portion 260P. In instances where the light blocking layer 260 is removed before depositing the contact liner layer 272, the source/drain contact structures 272 directly contacts sidewalls and bottom surfaces of the source/drain contact openings 252 (not shown)

Figure 3:
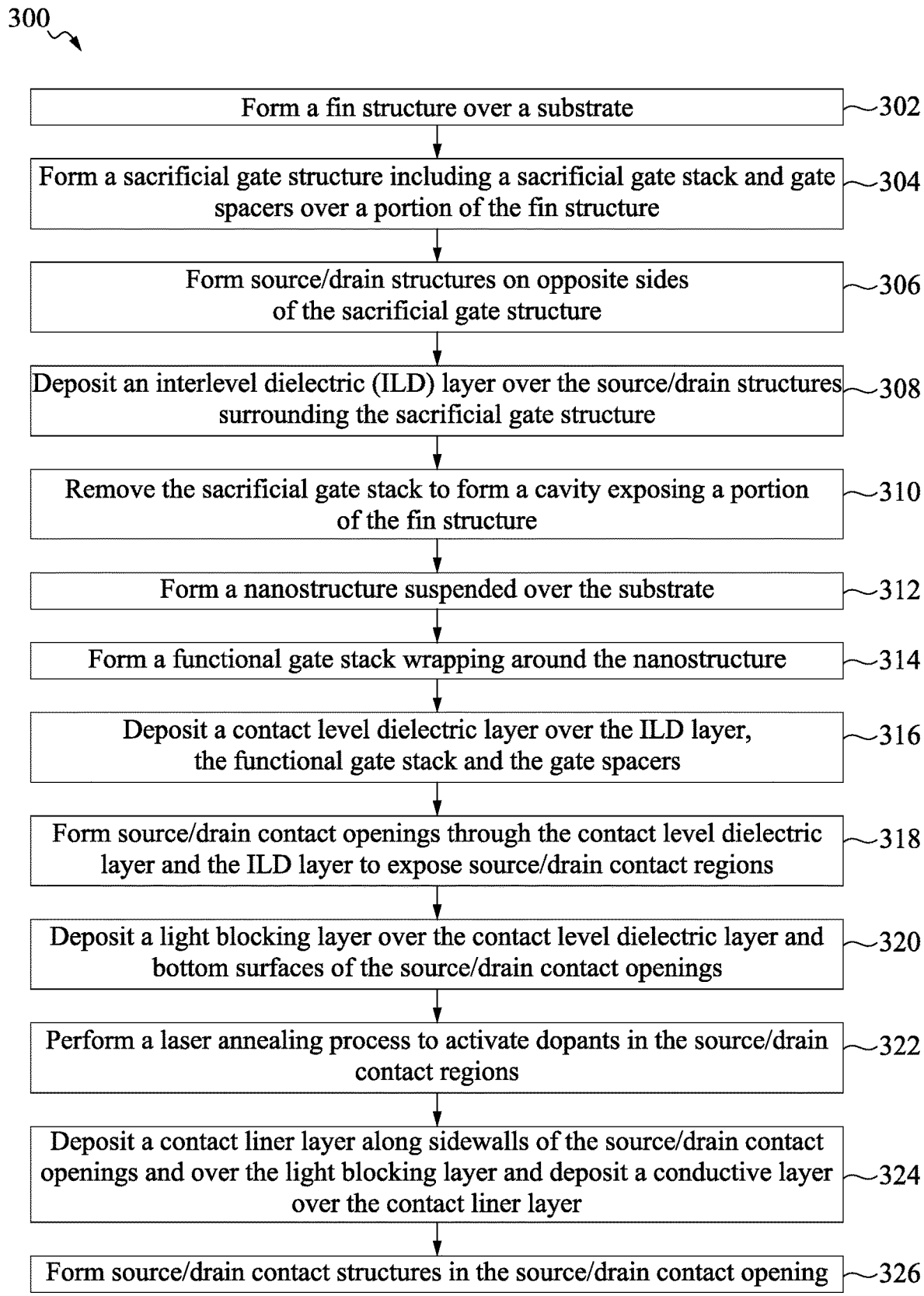
FIG. 3 is a flowchart of a method for fabricating a semiconductor FET device, in accordance with some embodiments.

FIG. 3 is a flowchart of a method 300 for fabricating a semiconductor FET device 400, in accordance with some embodiments. FIGS. 4A through 4D are cross-sectional views of the semiconductor FET device 400 at various stages of the fabrication process, in accordance with some embodiments. Unless specified otherwise, the materials and formation methods of the components in these embodiments are essentially the same as the like components, which are denoted by like reference numerals in the embodiments shown in FIGS. 2A through 2M. The formation details of the embodiment shown in FIGS. 4A through 4D may, thus, be found in the discussion of the embodiments shown in FIGS. 2A through 2M. The method 300 is discussed in detail below, with reference to the semiconductor FET device 400. The flowchart illustrates only a relevant part of the entire manufacturing process for the semiconductor FET device 400. It is understood that additional operations may be provided before, during, and after the operations shown by FIG. 3, and some of the operations described below can be replaced or eliminated for additional embodiments of the method. The order of the operations/processes may be interchangeable.

The initial steps of the method 300 may be essentially the same as shown in FIGS. 2A through 2J. Referring to FIG. 3, at operation 302, a fin structure 210 is fabricated over a substrate 202, as shown in FIG. 2A. At operation 304, a sacrificial gate structure 220 is formed over the fin structure 210, as shown in FIG. 2B. At operation 306, source/drain structures 230 are formed on opposite sides of the sacrificial gate structure 220, as shown in FIG. 2C. At operation 308, an ILD layer 232 is deposited over the source/drain structures 230 surrounding the sacrificial gate structure 220, as shown in FIG. 2D. At operation 310, the sacrificial gate stack (222, 224, 226) is removed to provide a cavity 234, as shown in FIG. 2E. At operation 312, a nanowire structure 214N is formed to suspend over the substrate 202, as shown in FIG. 2F. At operation 314, a functional gate stack (242, 244) is formed within the cavity 234 and the gap 236 between the nanowire structure 214N and the substrate 202, as shown in FIG. 2G. At operation 316, a contact level dielectric layer 250 is deposited over the ILD layer 232 and the functional gate structure (242, 244, 228), as shown in FIG. 2H. At operation 318, source/drain contact openings 252 are formed within the contact level dielectric layer 250 and the ILD layer 232, as shown in FIG. 2I.

Figure 4A:
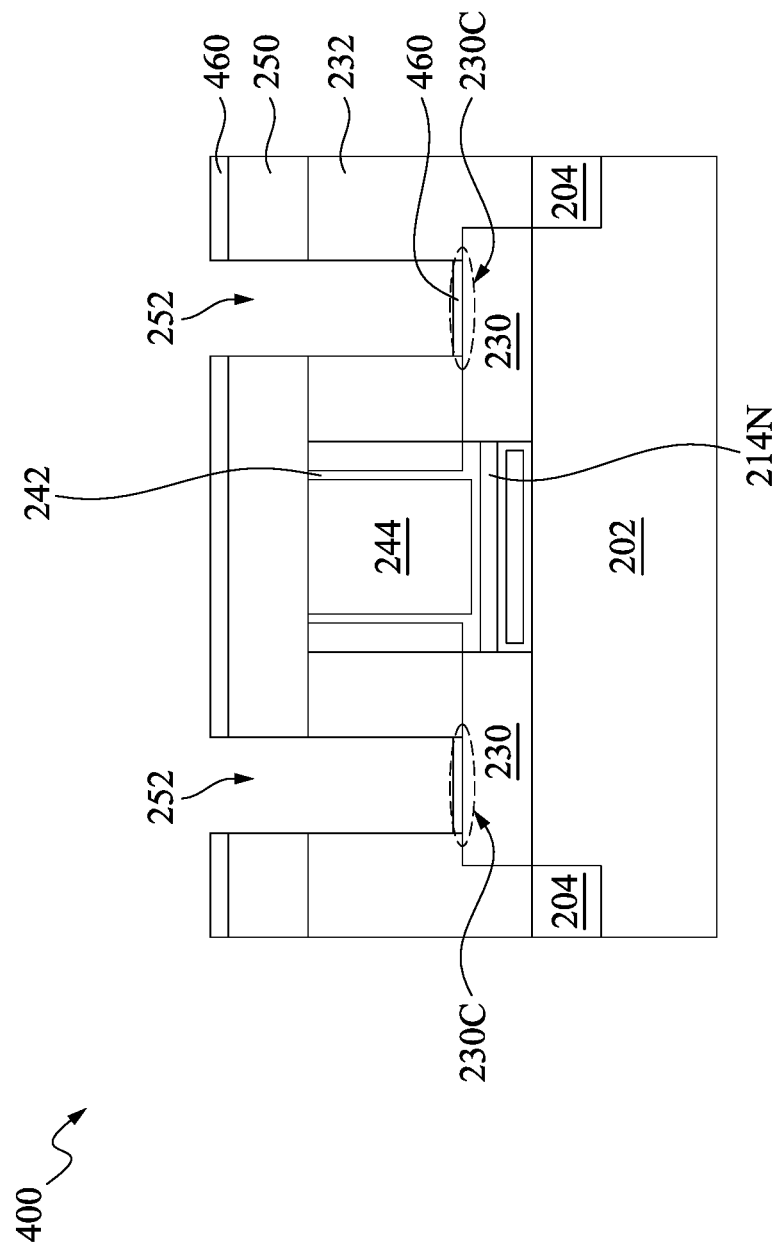
FIGS. 4A-4D are cross-sectional views of a semiconductor FET device at various stages of the fabrication process, in accordance with some embodiments.

Next, at operation 320 of FIG. 3, a light blocking layer 460 is deposited over the contact level dielectric layer 250 and along bottom surfaces of the source/drain contact openings 252, as shown in FIG. 4A. Compared to the light blocking layer 260 in FIG. 2J, the light blocking layer 460 comprises horizontal portions on the top surface of the contact level dielectric layer 250 and the bottom surfaces of source/drain contact openings 252, but does not comprise vertical portions on the sidewall surfaces of the source/drain contact openings 252. As in embodiments in 2A-2M, the light blocking layer 460 remains overlying the regions where the functional gate structure 242, 244, 228 and the nanowire structure 214N are located to protect the functional gate structure 242, 244, 228 and the nanowire structure 214N from thermal damage when a laser annealing process is performed to activate the dopants in the source/drain contact regions 230C.

In some embodiments, the light blocking layer 460 is an absorption layer configured to absorb the incident laser irradiation, thus preventing the laser irradiation from penetrating deeper into regions where the functional gate structure (242, 244, 228) and the nanowire structure 214N are located. In some embodiments, the light blocking layer 460 includes a material having a relatively high absorption coefficient at the laser irradiation wavelength. In some embodiments, the light blocking layer 460 includes Si, Ge, Al, Cr, Cu, Ge, Au, or Fe.

In some embodiments, the light blocking layer 460 is deposited using a non-conformal deposition process such as PVD. The non-conformal deposition process causes the light blocking material deposited on the horizontal surfaces, i.e., top surface of the contact level dielectric layer 250 and the bottom surfaces of source/drain contact openings 252, to be thicker than the light blocking material deposited on the vertical surfaces, i.e., the sidewalls surfaces of the source/drain contact openings 252. In some embodiments, the non-conformal deposition process is controlled so that the resulting light blocking layer 460 is present only on the top surface of the contact level dielectric layer 250 and the bottom surfaces of source/drain contact openings 252. Alternatively, in some embodiments, the non-conformal deposition process proceeds until the deposited light blocking material covers both the horizontal surfaces, i.e., top surface of the contact level dielectric layer 250 and the bottom surfaces of source/drain contact openings 252, and the vertical surfaces, i.e., the sidewalls surfaces of the source/drain contact openings 252. After deposition, an etching step is performed to remove the deposited light blocking material from the sidewalls of the source/drain contact openings 252. In some embodiments, a dry etch such as RIE is performed. In some embodiments, the etching mask is formed to cover the deposited light blocking material on the horizontal surfaces during the etching. In some embodiments, no etching mask is formed to cover the horizontal portions of the deposited material during etching. Because the thickness of the horizontal portions of the deposited light blocking material is greater than the thickness of the vertical portions of the deposited light blocking material, after the etching, the deposited light blocking material remains over the top surface of the contact level dielectric layer 250 and the bottoms surfaces of the source/drain contact openings 252 to provide the light blocking layer 460, while sidewalls of the source/drain contact openings 252 are free of the deposited light blocking material.

Figure 4B:
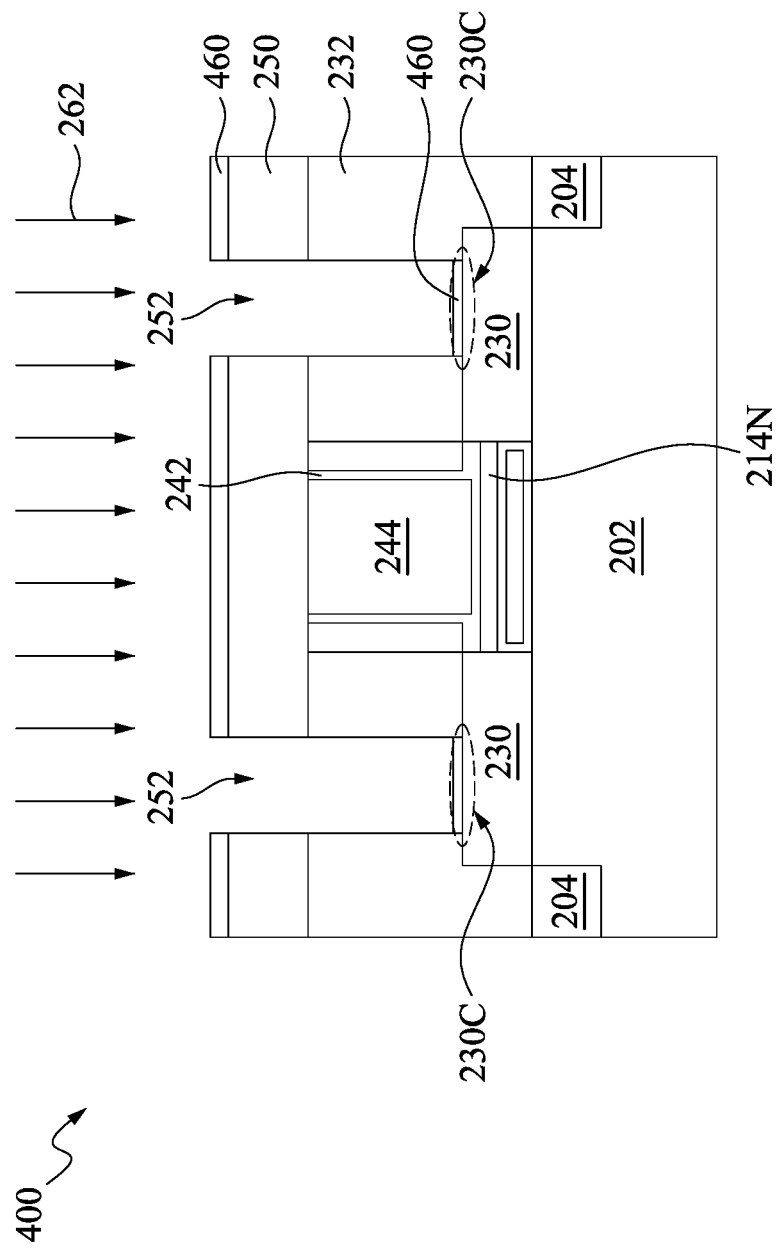

At operation 322 of FIG. 3, a laser annealing process is performed to activate dopants in the source/drain contact regions 230C, as shown in FIG. 4B. The laser annealing process is performed by directing laser irradiation 262 to the semiconductor FET device 200 using the processing conditions described above in FIG. 2K.

Figure 4C:
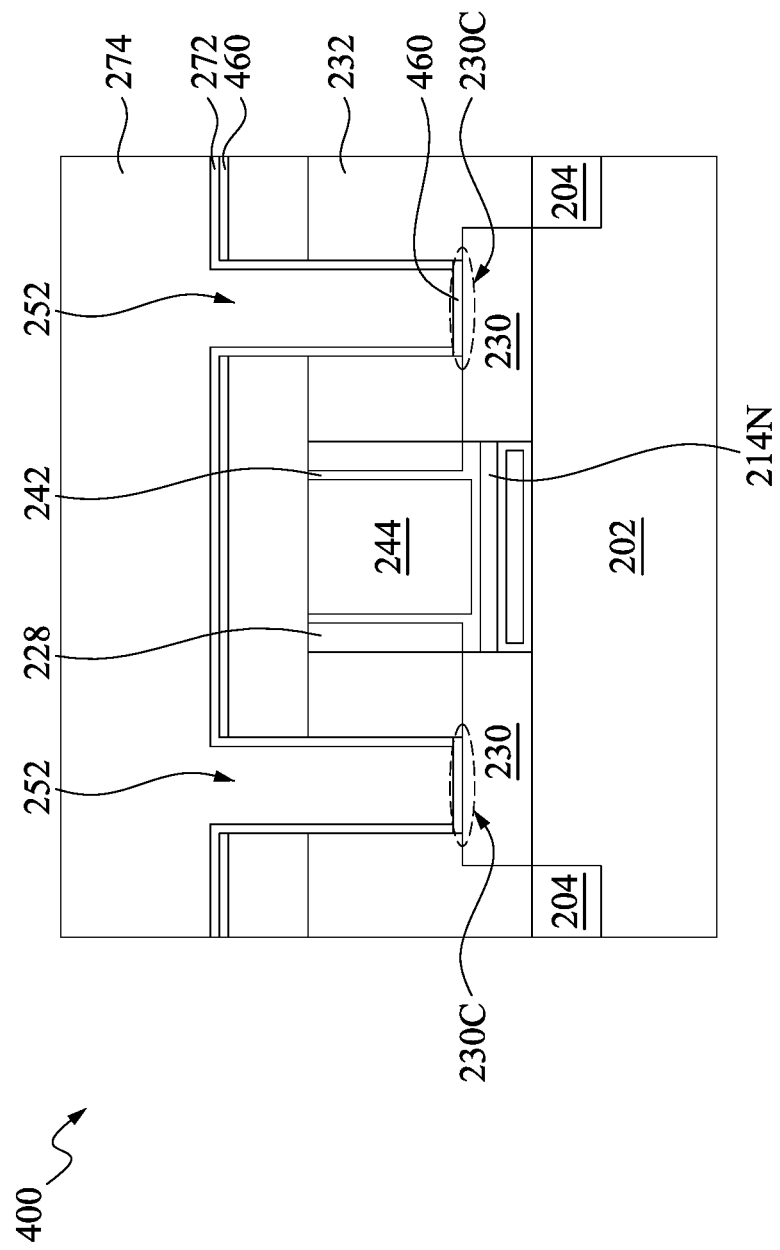

At operation 324 of FIG. 1, a contact liner layer 272 is deposited along sidewalls of the source/drain contact openings 252 and over the light blocking layer 260 present on the bottom surfaces of the source/drain contact openings 252 and the top surface of the contact level dielectric layer 250, followed by depositing a contact material layer 274 over the contact liner layer 272, as shown in FIG. FIG. 4C. The contact material layer 274 fills remaining volumes of the source/drain contact openings 252. The contact liner layer 272 and the contact material layer 274 are deposited using the processing steps described above in FIG. 2L.

Figure 4D:
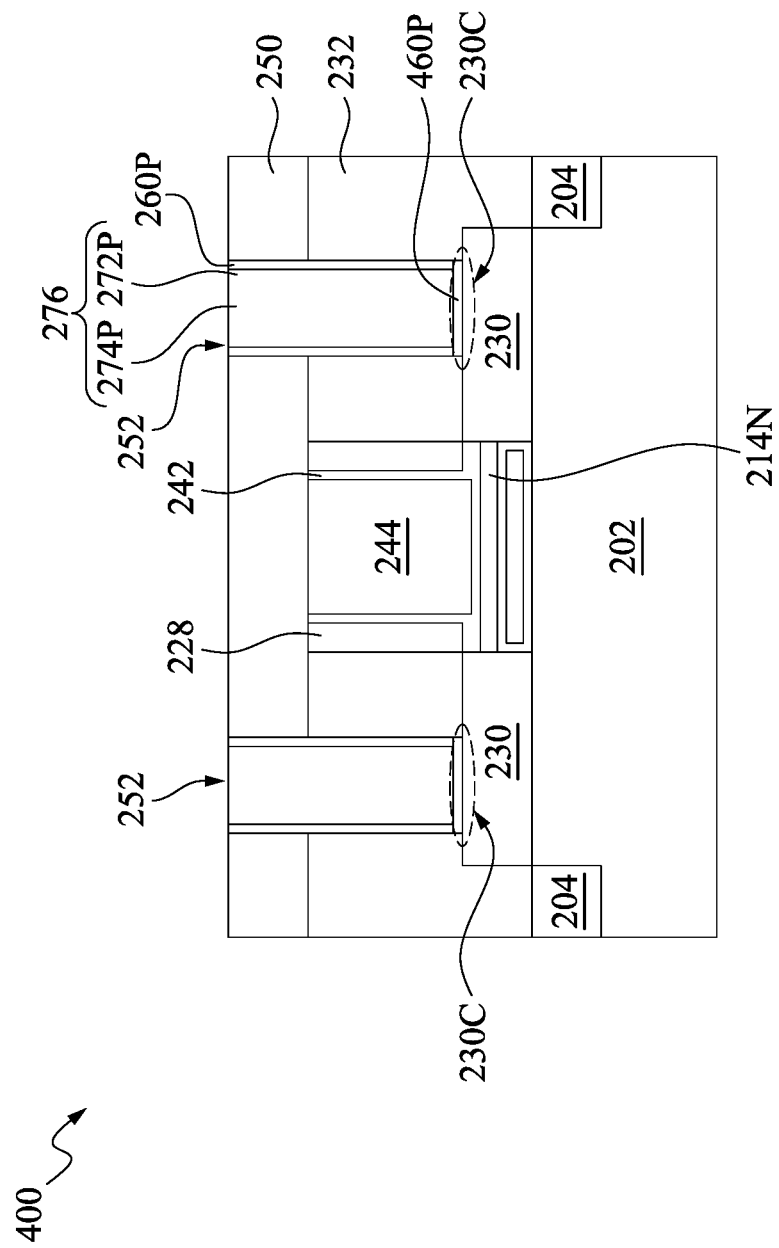

At operation 326 of FIG. 3, portions of the contact material layer 274, the contact liner layer 272, and the light blocking layer 460 that are located above the top surface of the contact level dielectric layer 250 are removed using a planarization process, as shown in FIG. 4D. In some embodiments, a CMP process is performed. After the planarization, a portion of the contact material layer 274 remaining in each source/drain contact openings 252 constitutes a contact plug 274P, a portion of the contact liner layer 272 remaining in each source/drain contact openings 252 constitutes a contact liner 272P, and a portion of the light blocking layer 460 remaining in each source/drain contact opening 252 constitutes of a light blocking portion 460P. Top surfaces of the conductive portion 274P, the contact liner 272P, and the light blocking portion 460P within each source/drain contact opening 252 are coplanar with the top surface of the contact level dielectric layer 250.

Source/drain contact structures 276 are, thus, formed within the source/drain contact openings 252, contacting the source/drain contact regions 230C. Each of the source/drain contact structures 276 includes a contact liner 272P overlying a light blocking portion 460P and a contact plug 274P over the contact liner 272P. Within a source/drain contact opening 252, the light block portion 460P is present on a bottom surface of the source/drain contact opening 252, and the contact liner 272P is present on sidewall surfaces of the source/drain contact opening 252.

Figure 5:
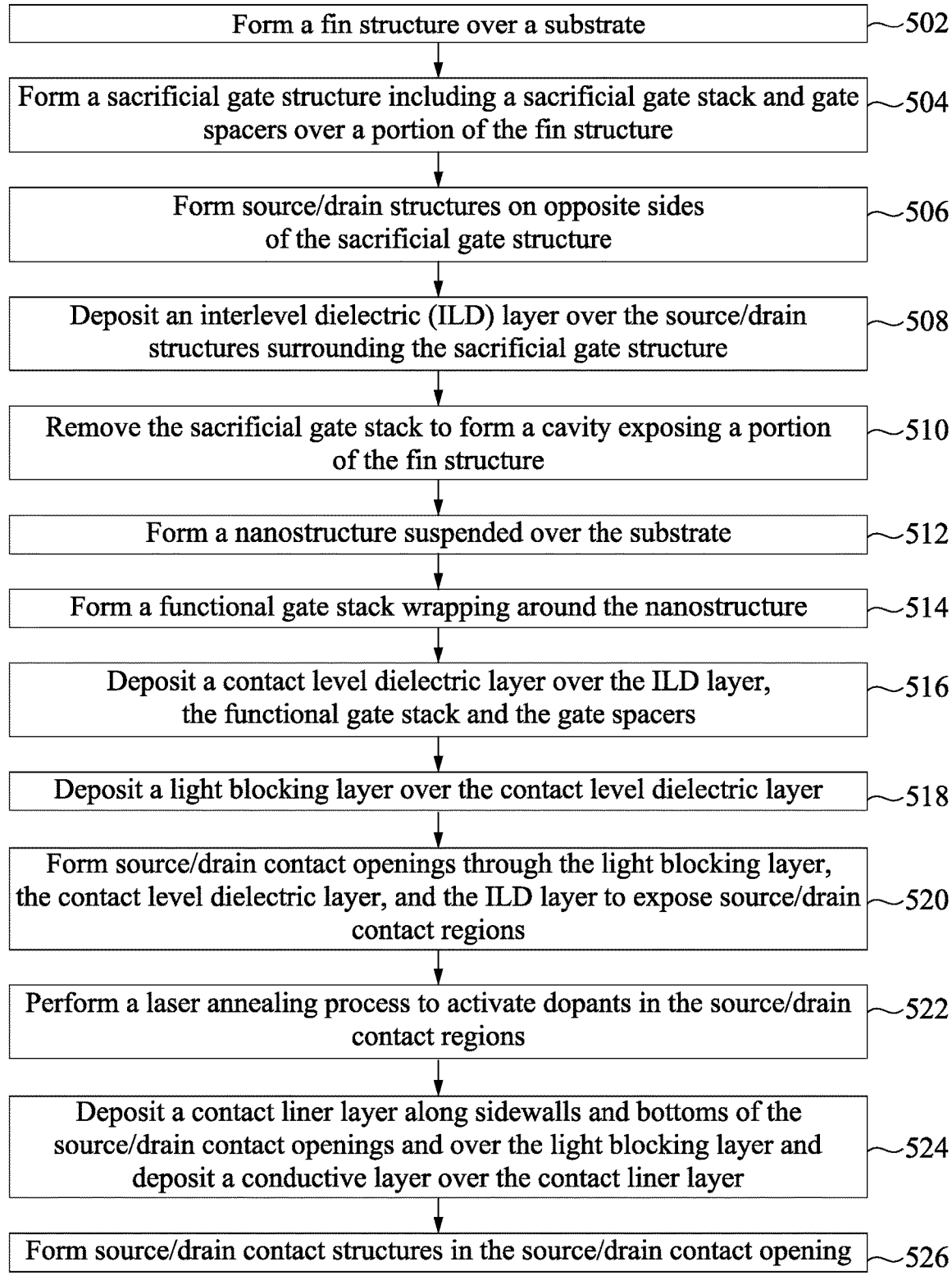
FIG. 5 is a flowchart of a method fabricating a semiconductor FET device, in accordance with some embodiments.

FIG. 5 is a flowchart of a method 500 for fabricating a semiconductor FET device 600, in accordance with some embodiments. FIGS. 6A through 6E are cross-sectional views of the semiconductor FET device 600 at various stages of the fabrication process, in accordance with some embodiments. Unless specified otherwise, the materials and formation methods of the components in these embodiments are essentially the same as the like components, which are denoted by like reference numerals in the embodiments shown in FIGS. 2A through 2M. The formation details of the embodiment shown in FIGS. 6A through 6E may, thus, be found in the discussion of the embodiments shown in FIGS. 2A through 2M. The method 500 is discussed in detail below, with reference to the semiconductor FET device 600. The flowchart illustrates only a relevant part of the entire manufacturing process for the semiconductor FET device 600. It is understood that additional operations may be provided before, during, and after the operations shown by FIG. 5, and some of the operations described below can be replaced or eliminated for additional embodiments of the method. The order of the operations/processes may be interchangeable.

The initial steps of the method 500 may be essentially the same as shown in FIGS. 2A through 2H. Referring to FIG. 5, at operation 502, a fin structure 210 is fabricated over a substrate 202, as shown in FIG. 2A. At operation 504, a sacrificial gate structure 220 is formed over the fin structure 210, as shown in FIG. 2B. At operation 506, source/drain structures 230 are formed on opposite sides of the sacrificial gate structure 220, as shown in FIG. 2C. At operation 508, an ILD layer 232 is deposited over the source/drain structures 230 surrounding the sacrificial gate structure 220, as shown in FIG. 2D. At operation 510, the sacrificial gate stack (222, 224, 226) is removed to provide a cavity 234, as shown in FIG. 2E. At operation 512, a nanowire structure 214N is formed to suspend over the substrate 202, as shown in FIG. 2F. At operation 514, a functional gate stack (242, 244) is formed within the cavity 234 and the gap 236 between the nanowire structure 214N and the substrate 202, as shown in FIG. 2G. At operation 516, a contact level dielectric layer 250 is deposited over the ILD layer 232 and the functional gate structure (242, 244, 228), as shown in FIG. 2H.

Figure 6A:
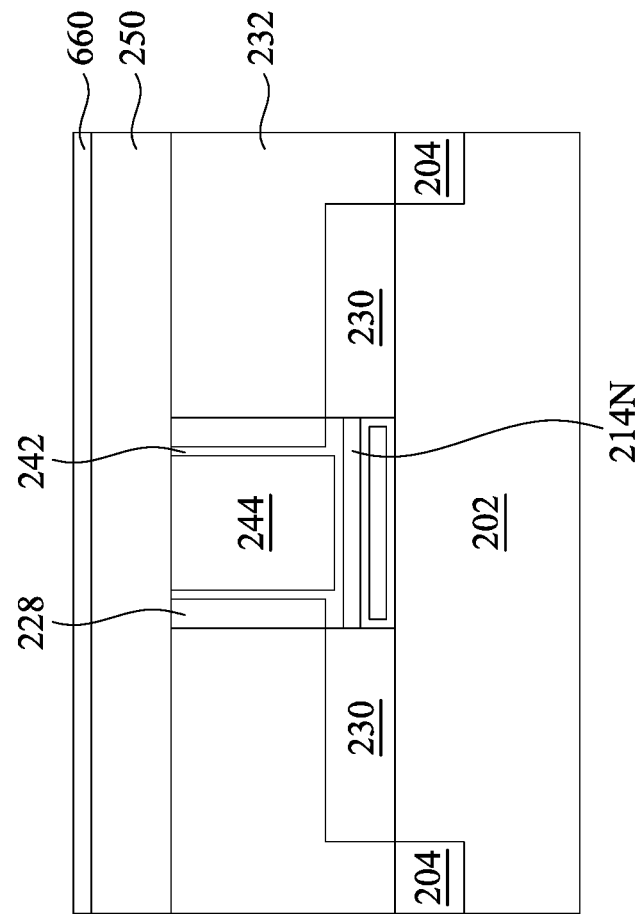
FIGS. 6A-6E are cross-sectional views of a semiconductor FET device at various stages of the fabrication process, in accordance with some embodiments.

Next, at operation 518 of FIG. 5, a light blocking layer 660 is deposited over the contact level dielectric layer 250, as shown in FIG. 6A. The light blocking layer 660 is employed to allow laser irradiation to penetrate only into surface portions of the source/drain contact regions 232C and the contact level dielectric layer 250, thereby reducing the likelihood of thermal damage to the functional gate structure (242, 244, 228) and the nanowire structure 214N during a laser annealing process subsequently performed to activate dopants in the source/drain contact regions 230C.

In some embodiments, the light blocking layer 660 is an absorption layer configured to absorb the incident laser irradiation, thus preventing the laser irradiation from penetrating deeper into regions where the functional gate structure (242, 244, 228) and the nanowire structure 214N are located. In some embodiments, the light blocking layer 660 includes a material having a relatively high absorption coefficient at the laser irradiation wavelength. In some embodiments, the light blocking layer 660 includes Si, Ge, Al, Cr, Cu, Ge, Au, or Fe.

Alternatively, in some embodiments, the light blocking layer 660 is a reflective layer configured to reflect a least a portion of the incident laser irradiation off the semiconductor FET device 600, thus preventing the laser irradiation from penetrating deeper into regions where the functional gate structure (242, 244, 228) and the nanowire structure 214N are located.

In some embodiments, the light blocking layer 660 is deposited using a deposition process such as CVD, PECVD, PVD, or ALD. The thickness of the light blocking layer 660 depends on the light blocking mechanism being used. In instances where the light blocking layer 660 is used as an absorption layer, the thickness of the light blocking layer 660 is from about 5 nm to about 10 nm. If the thickness of the light blocking layer 660 is too small, the light blocking layer 660 is unable to sufficiently absorb the laser irradiation so as to prevent the laser irradiation from penetrating deeper to regions where the functional gate structure (242, 244, 228) and nanowire structure 214N are located, and the risk of thermal damage to the functional gate structure (242, 244, 228) and nanowire structure 214N increases, in some instances. If the thickness of the light blocking layer 660 is too great, the laser irradiation is unable to effectively heat the source/drain contact regions 230C, and the total time necessary to achieve the desired dopant activation level is increased, in some instances. In instances where the light blocking layer 660 is used as a reflective layer, the thickness of the light blocking layer 660 is from about 10 nm to about 20 nm. If the thickness of the light blocking layer 660 is too small, the light blocking layer 660 is unable to sufficiently reflect the laser irradiation off the regions where the functional gate structure (242, 244, 228) and nanowire structure 214N are located, and the risk of thermal damage to the functional gate structure (242, 244, 228) and nanowire structure 214N increases, in some instances. If the thickness of the light blocking layer 660 is too great, no further increase in the reflection efficiency occurs, but the material is wasted and production costs increases, in some instances.

Figure 6B:
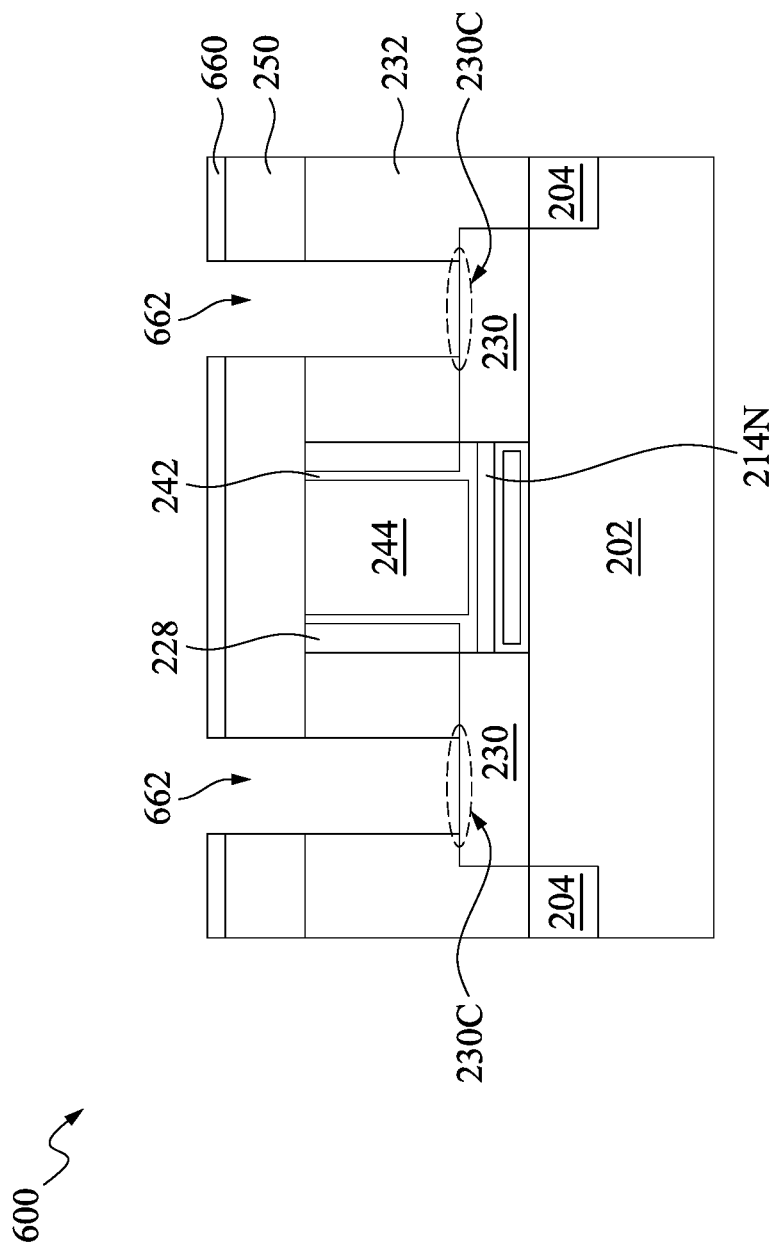

At operation 520 of FIG. 5, source/drain contact openings 662 are formed extending through the light blocking layer 260, the contact level dielectric layer 250, and the ILD layer 232, exposing source/drain contact regions 230C, as shown in FIG. 6B.

In some embodiments, the source/drain contact openings 662 are formed by applying a photoresist layer over the light blocking layer 660, and then lithographically patterning the photoresist layer to form openings therein. Each opening overlies a portion of one of the source/drain structures 230. The pattern in the photoresist layer is transferred through the light blocking layer 660, the contact level dielectric layer 250, and the ILD layer 232 using an anisotropic etch to form the source/drain contact openings 662. In some embodiments, a dry etch such as, for example, RIE or plasma etch, is performed to remove exposed portions of the light blocking layer 660, the contact level dielectric layer 250, and the ILD layer 232. In some embodiments and as shown, the source/drain contact openings 662 are formed to have substantially vertical sidewalls. In some embodiments, the source/drain contact openings 662 are formed to have tapered sidewalls. After formation of the source/drain contact openings 662, the remaining photoresist layer is removed, for example, by ashing.

The etching process that forms source/drain contact openings 662 removes the light blocking layer 660 from the source/drain contact regions 230C, while regions where the functional gate structure (242, 244, 228) and the nanowire structure 214N are located remain covered by the light blocking layer 660.

Figure 6C:
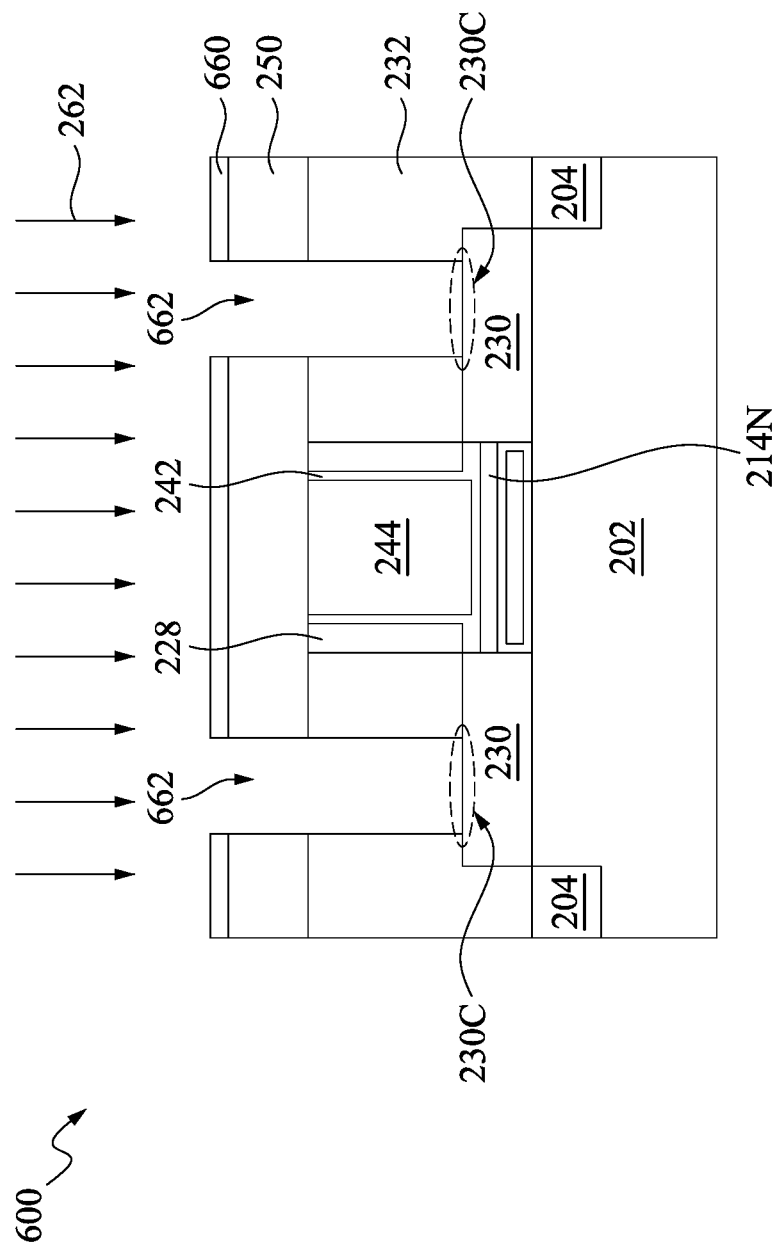

At operation 522 of FIG. 5, a laser annealing process is performed to activate dopants in the source/drain contact regions 230C, as shown in FIG. 6C. The laser annealing process is performed by directing laser irradiation 262 to the semiconductor FET device 600 using the processing conditions described above in FIG. 1K.

During the laser annealing process, the light blocking layer 660 either absorbs or reflects the laser irradiation 262, thus preventing the laser irradiation 262 from penetrating deeper into the regions where the functional gate structure (242, 244, 228) and the nanowire structure 214N are located. As a result, the light blocking layer 660 helps to prevent the thermal damage to the functional gate structure (242, 244, 228) and the nanowire structure 214N, which helps to improve device reliability and performance. In addition, because the light blocking layer 660 is removed from the source/drain contact regions 230C during formation of the source/drain contact openings 662, the laser irradiation 262 is able to be directly incident on the source/drain contact regions 230C to heat the source/drain contact region 230C. By confining the heat to the source/drain contact regions 230, the light blocking layer 660 helps to achieve higher local dopant activation efficiency. Furthermore, because the introduction of the light blocking layer 260 allows performing dopant activation in the source/drain contact regions 230C after formation of the functional gate structure (242, 244, 248), the deactivation of the dopants in the source/drain contact regions 230C caused by the functional gate formation process is prevented. As a result, the device reliability and performance are increased. The dopant activation is a self-aligned process, and only the source/drain contact regions 230C that are not covered by the light blocking layer 660 are directly illuminated by the laser irradiation 262.

Figure 6D:
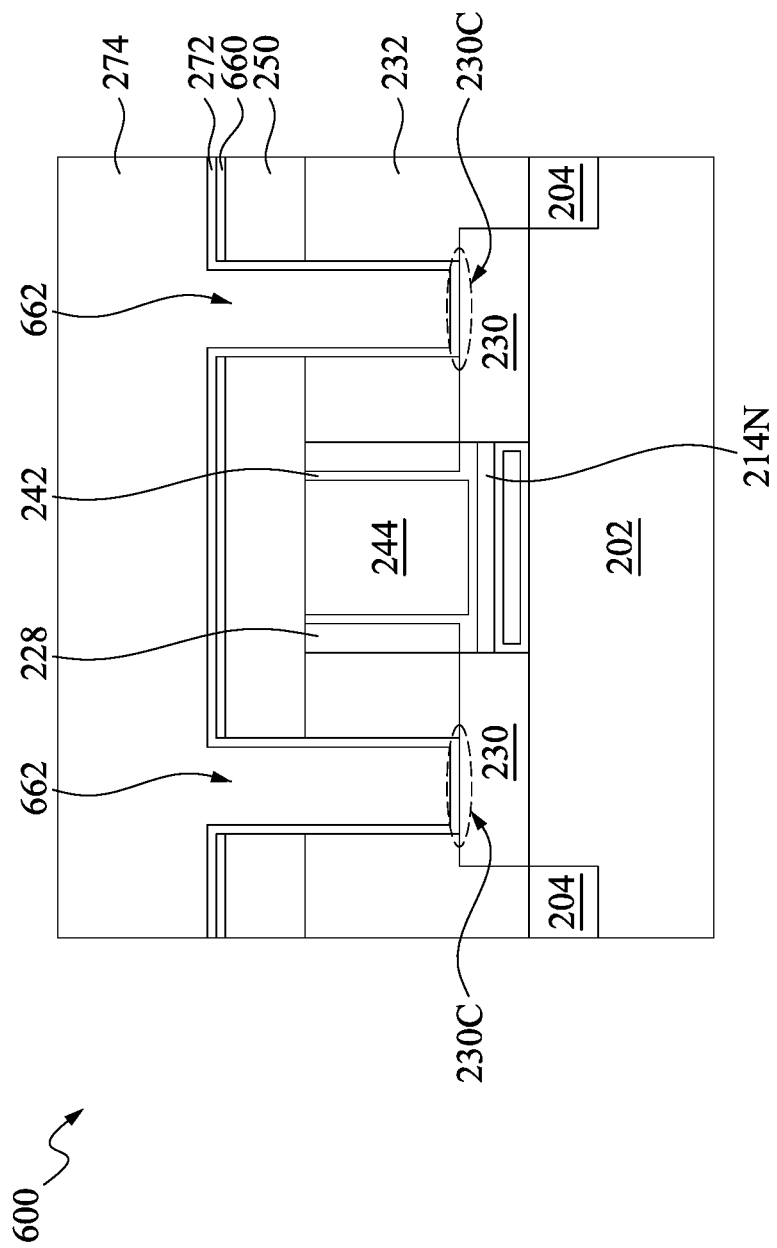

At operation 524 of FIG. 5, a contact liner layer 272 is deposited along sidewalls and bottoms of the source/drain contact openings 662 and over the light blocking layer 660, followed by depositing a contact material layer 274 over the contact liner layer 272, as shown in FIG. 6D. The contact material layer 274 fills remaining volumes of the source/drain contact openings 662. The contact liner layer 272 and the conductive layer 274 are deposited using the processing steps described above in FIG. 1C.

Figure 6E:
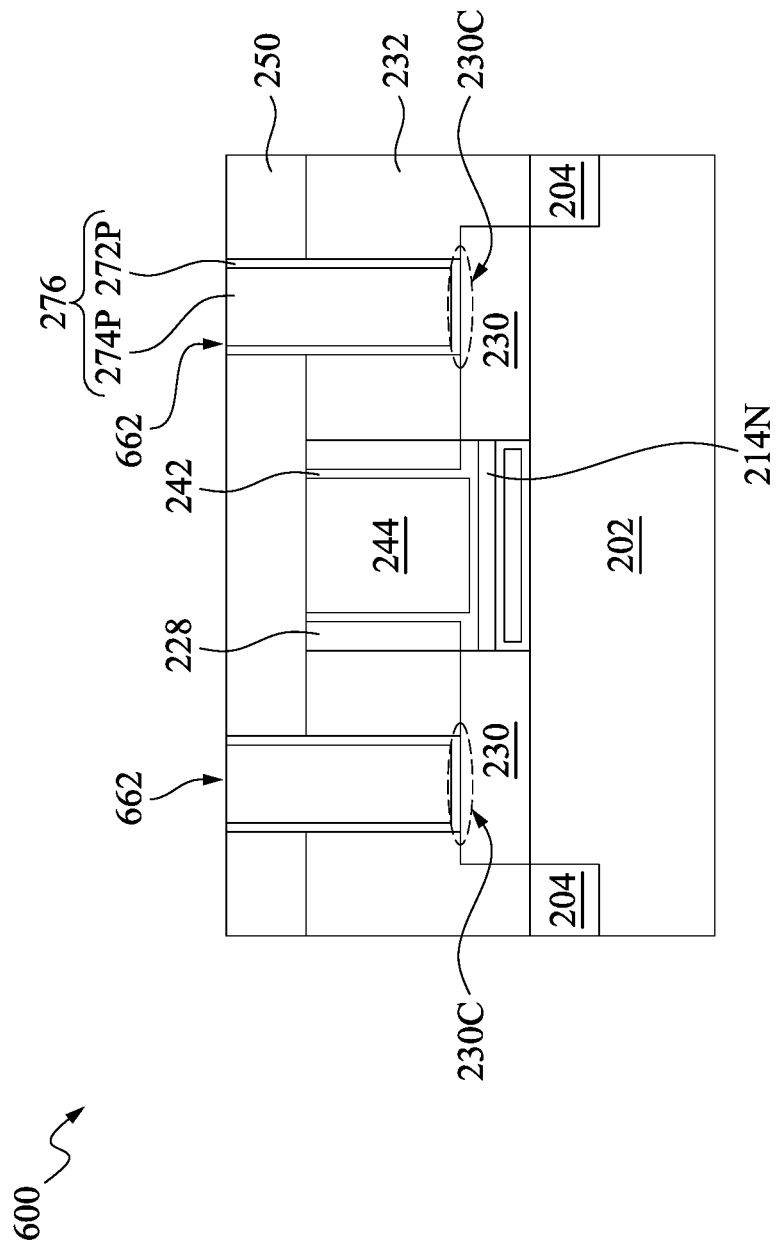

At operation 526 of FIG. 5, portions of the conductive layer 274, the contact liner layer 272, and the light blocking layer 260 that are located above the top surface of the contact level dielectric layer 250 are removed using a planarization process, as shown in FIG. 6E. In some embodiments, a CMP process is performed. After the planarization, no light blocking layer 660 remains in the semiconductor FET device 600. A portion of the conductive layer 274 remaining in each source/drain contact openings 662 constitutes a conductive portion 274P, a portion of the contact liner layer 272 remaining in each source/drain contact opening 662 constitutes a contact liner 272P. Top surfaces of the conductive portion 274P and the contact liner 272P within each source/drain contact opening 252 are coplanar with the top surface of the contact level dielectric layer 250.

Source/drain contact structures 276 are, thus, formed within the source/drain contact openings 662, contacting the source/drain contact regions 230C. Each of the source/drain contact structures 276 includes a contact liner 272P present on sidewalls and a bottom surface of a corresponding source/drain contact opening 662 and a conductive portion 274P over the contact liner 272P.

One aspect of this description relates to a method of forming a semiconductor device. The method includes forming source/drain contact openings extending through at least one dielectric layer to expose source/drain contact regions of source/drain structures. The method further includes depositing a light blocking layer along sidewalls and bottom surfaces of the source/drain contact openings and a topmost surface of the at least one dielectric layer. The method further includes performing a laser annealing process to activate dopants in the source/drain contact regions. The method further includes forming source/drain contact structures within source/drain contact openings. In some embodiments, performing the laser annealing process includes using a nanosecond laser source. In some embodiments, forming the source/drain contact openings includes performing an anisotropic etch process to etch the at least one dielectric layer. In some embodiments, forming source/drain contact structure includes depositing a contact liner layer over the light blocking layer, depositing a contact material layer over the contact liner layer to fill the source/drain contact openings, and removing portions of the contact material layer, the contact liner layer, and the light blocking layer from the topmost surface of the at least one dielectric layer. In some embodiments, the method further includes removing portions of the light blocking layer from the sidewalls of the source/drain contact openings prior to the performing the laser annealing process. In some embodiments, depositing the light blocking layer includes depositing an absorption layer. In some embodiments, depositing the absorption layer includes depositing silicon, germanium, aluminum, chromium, copper, gold, or iron.

Another aspect of this description relates to a method of forming a semiconductor device. The method includes forming a filed effect transistor (FET) device over a substrate. The FET device includes a nanowire structure, a gate structure around the nanowire structure, and source/drain structures on opposite sides of the gate structure. The gate structure is surrounded by a first dielectric layer. The method further includes depositing a second dielectric layer over the gate structure and the first dielectric layer. The method further includes depositing a light blocking layer over the second dielectric layer. The method further includes forming source/drain contact openings extending through the light blocking layer, the second dielectric layer, and the first dielectric layer to expose source/drain contact regions of the source/drain structures. The method further includes performing a laser annealing process to activate dopants in the source/drain contact regions. The method further includes forming source/drain contact structures within source/drain contact openings. In some embodiments, forming the source/drain contact structure include depositing a contact liner layer over a top surface of the light blocking layer and along sidewall and bottom surfaces of the source/drain contact openings, depositing a contact material layer over the contact liner layer to fill the source/drain contact openings, and removing portions of the contact material layer, the contact liner layer, and the light blocking layer from a top surface of the second dielectric layer. In some embodiments, depositing the light blocking layer includes depositing a light absorption material. In some embodiments, depositing the light blocking layer includes depositing silicon, germanium, aluminum, chromium, copper, gold, or iron. In some embodiments, depositing the light blocking layer comprises depositing a light reflective material. In some embodiments, depositing the light blocking layer includes depositing molybdenum (Mo), ruthenium (Ru), or a multi-layer stack of Mo—Si. In some embodiments, the method further includes forming the nanowire structure: The forming the nanowire structure includes forming a fin structure comprising a first semiconductor segment and a second semiconductor segment over the substrate, forming a sacrificial gate structure over the fin structure, the sacrificial gate structure comprising a sacrificial gate stack and gate spaces on opposite sidewalls of the sacrificial gate stacks, forming the source/drain structures on opposite sides of the sacrificial gate structure, removing the sacrificial gate stack to provide a cavity, removing the first semiconductor segment, and annealing the second semiconductor segment to form the nanowire structure. The nanostructure is suspended over the substrate by a gap. In some embodiments, the method further includes forming the gate structure in the cavity and the gap.

Still another aspect of this description relates to a semiconductor device. The semiconductor device includes a semiconductor channel, a gate structure over the semiconductor channel, source/drain structures on opposite sides of the gate structure, source/drain contact structures overlying source/drain contact regions of the source/drain structures, and light blocking portions between the source/drain contact structures and the source/drain contact regions. In some embodiments, each of the source/drain contact structures includes a contact liner and a contact plug surrounded by the contact liner. In some embodiments, each of the light blocking portions is on a bottom surface of a corresponding source/drain contact opening. The contact liner is over a corresponding light blocking portion and sidewalls of the corresponding source/drain contact opening. In some embodiments, each of the light blocking portions is on sidewalls and bottom surfaces of a corresponding source/drain contact opening. The contact liner is surrounded by a corresponding light blocking portion. In some embodiments, the semiconductor channel is suspended from a substrate. The gate structure wraps around the semiconductor channel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor channel;
   a gate structure over the semiconductor channel;
   source/drain structures on opposite sides of the gate structure;
   source/drain contact structures overlying the source/drain structures; and
   light blocking portions between the source/drain contact structures and the source/drains structures, wherein each of the light blocking portions includes a first portion in contact with sidewalls of a corresponding source/drain contact structure and a second portion in contact with a bottom surface of the corresponding source/drain contact structure, the first portion and the second portion comprising a same light blocking material.

2. The semiconductor device of claim 1, wherein the light blocking material comprises silicon, germanium, aluminum, chromium, copper, gold or iron.

3. The semiconductor device of claim 1, wherein each of the source/drain contact structures comprises a contact liner and a contact plug surrounded by the contact liner.

4. The semiconductor device of claim 3, wherein the contact liner comprises titanium, tantalum, nickel, ruthenium, titanium nitride, tantalum nitride, ruthenium nitride or an alloy thereof.

5. The semiconductor device of claim 3, wherein the contact liner comprises a stack of titanium/titanium nitride or tantalum/tantalum nitride.

6. The semiconductor device of claim 3, wherein the contact plug comprises copper, tungsten or cobalt.

7. The semiconductor device of claim 1, wherein the semiconductor channel is suspended from a substrate, the gate structure wrapping around the semiconductor channel.

8. The semiconductor device of claim 1, wherein the source/drain structures comprise phosphorous doped SiC or boron doped SiGe.

9. The semiconductor device of claim 1, wherein a thickness of the second portion of each of the light blocking portions is greater than a thickness of the first portion of each of the light blocking portions.

10. A semiconductor device, comprising:
a semiconductor nanostructure over a substrate;
a gate dielectric disposed on and wrapping around a channel region of the semiconductor nanostructure;
a gate electrode disposed on the gate dielectric and wrapping around the channel region of the semiconductor nanostructure;
a source/drain structure over the substrate and contacting a sidewall of the semiconductor nanostructure;
a light blocking layer over a contact region of the source/drain structure;
a dielectric layer disposed over the source/drain structure and the substrate, the dielectric layer laterally surrounding the gate electrode; and
a source/drain contact structure extending through the dielectric layer to electrically contact with the source/drain structure, wherein an entirety of the source/drain contact structure is surrounded by the light blocking layer.

11. The semiconductor device of claim 10, the light blocking layer comprises aluminum, chromium, copper, gold or iron.

12. The semiconductor device of claim 10, wherein the semiconductor nanostructure is a semiconductor nanowire.

13. The semiconductor device of claim 10, wherein the semiconductor nanostructure comprises Si, Ge or SiGe.

14. The semiconductor device of claim 10, wherein the source/drain contact structure comprises a contact plug and a contact liner surrounding the contact plug, the contact liner in contact with the light blocking layer.

15. The semiconductor device of claim 10, wherein the dielectric layer comprises a low-k dielectric material.

16. The semiconductor device of claim 10, wherein the source/drain structure comprises an epitaxial semiconductor material selected from the group consisting of Si, Ge, SiP, SiC, SiGe and SiGeC.

17. The semiconductor device of claim 10, further comprising a gate spacer laterally surrounding the gate dielectric, wherein a portion of the gate dielectric underlies the gate spacer.

18. A semiconductor device, comprising:
a semiconductor nanostructure over a substrate;
a gate structure disposed on and wrapping around a channel region of the semiconductor nanostructure;
a source/drain structure over the substrate and contacting a sidewall of the semiconductor nanostructure;
a first dielectric layer over the substrate and the source/drain structure, the first dielectric layer laterally surrounding the gate structure;
a second dielectric layer over the first dielectric layer and the gate structure;
a source/drain contact structure extending through the second dielectric layer and the first dielectric layer to provide electrical contact to the source/drain structure; and
a light blocking layer having a first portion disposed between the source/drain contact structure and the source/drain structure and a second portion disposed between the source/drain contact structure and the first and the second dielectric layers,
wherein the source/drain contact structure comprises a contact plug and a contact liner surrounding the contact plug, wherein an entirety of the contact liner is in contact with the light blocking layer.

19. The semiconductor device of claim 18, the light blocking layer comprises aluminum, chromium, copper, gold or iron.

20. The semiconductor device of claim 18, wherein the light blocking layer has a thickness ranging from 5 nm to 10 nm.

* * * * *